(12) United States Patent
Yaegashi

(10) Patent No.: US 9,818,612 B2
(45) Date of Patent: Nov. 14, 2017

(54) METHOD FOR MANUFACTURING SEMICONDUCTOR DEVICE

(71) Applicant: TOKYO ELECTRON LIMITED, Tokyo (JP)

(72) Inventor: Hidetami Yaegashi, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/008,529

(22) Filed: Jan. 28, 2016

(65) Prior Publication Data

US 2016/0225623 A1 Aug. 4, 2016

(30) Foreign Application Priority Data

Jan. 30, 2015 (JP) ................... 2015-016406

(51) Int. Cl.
*H01L 21/302* (2006.01)
*H01L 21/033* (2006.01)
*H01L 21/027* (2006.01)

(52) U.S. Cl.
CPC ...... *H01L 21/0338* (2013.01); *H01L 21/0273* (2013.01); *H01L 21/0337* (2013.01)

(58) Field of Classification Search
CPC ........... H01L 21/31144; H01L 21/0276; H01L 21/0332; H01L 21/0338; H01L 21/0337; H01L 21/027
USPC ....... 438/706, 710, 714, 717, 719, 723, 725, 438/736; 216/41, 43, 47
See application file for complete search history.

(56) References Cited

U.S. PATENT DOCUMENTS

| 8,129,100 B2 * | 3/2012 | Takemura | G03F 7/0035 430/325 |
| 2011/0237082 A1 * | 9/2011 | Nakajima | G03F 7/0035 438/703 |
| 2012/0141943 A1 * | 6/2012 | Sills | G03F 7/40 430/319 |
| 2012/0305183 A1 * | 12/2012 | Yaegashi | H01L 21/0273 156/345.1 |

FOREIGN PATENT DOCUMENTS

| JP | 2012-33923 A | 2/2012 |
| JP | 2013-533611 A | 8/2013 |
| JP | 2014-56864 A | 3/2014 |
| JP | 2014-72226 A | 4/2014 |

(Continued)

*Primary Examiner* — Lan Vinh
(74) *Attorney, Agent, or Firm* — Rothwell, Figg, Ernst & Manbeck, P.C.

(57) ABSTRACT

Disclosed is a method for manufacturing a semiconductor device. The method includes: a first pattern forming step of forming, on a pattern forming target film, a first film that is patterned to have a first pattern that includes lines which are aligned with each other with spaces of a predetermined interval being interposed therebetween, and include a portion separated by using a first cut mask; a step of forming a second film to cover a surface of the first film; and a second pattern forming step of forming a pattern forming target film that is patterned to have a second pattern, by separating a portion of the space of the first step using a second cut mask. The first and second cut mask includes a plurality of openings or light shielding portions that have equal shapes, respectively.

6 Claims, 44 Drawing Sheets

(56) References Cited

FOREIGN PATENT DOCUMENTS

| JP | 2014-135417 A | 7/2014 |
| JP | 2014-165271 A | 9/2014 |
| WO | 2011/151243 A1 | 12/2011 |

* cited by examiner

FIG. 28A
FIG. 28B
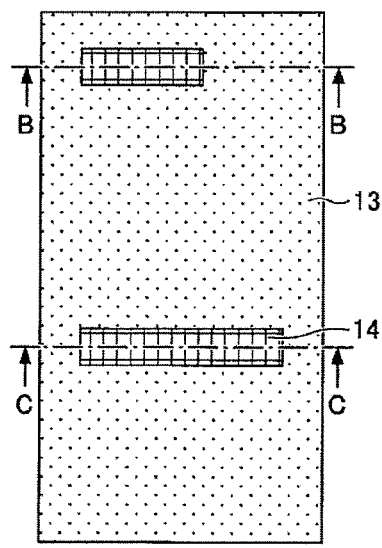
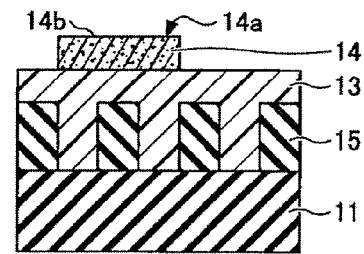
FIG. 28C
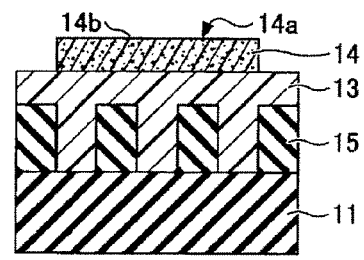
FIG. 29A
FIG. 29B
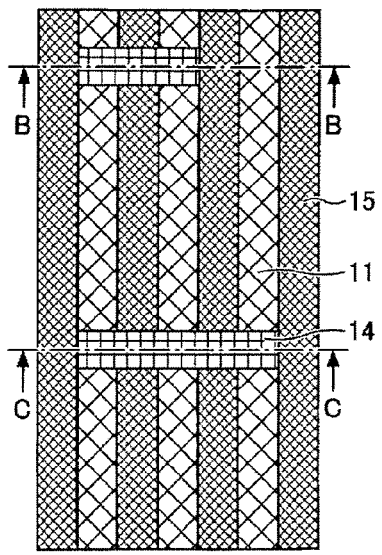
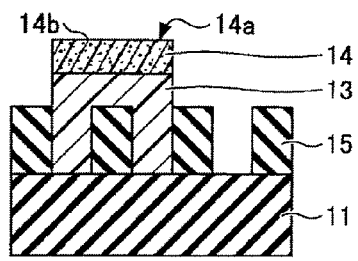
FIG. 29C
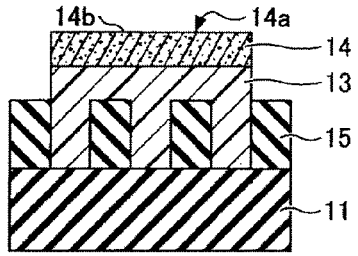

METHOD FOR MANUFACTURING SEMICONDUCTOR DEVICE

CROSS-REFERENCE TO RELATED APPLICATIONS

This application is based on and claims priority from Japanese Patent Application No. 2015-016406, filed on Jan. 30, 2015, with the Japan Patent Office, the disclosure of which is incorporated herein in its entirety by reference.

TECHNICAL FIELD

The present disclosure relates to a method for manufacturing a semiconductor device.

BACKGROUND

In accordance with high integration of a semiconductor device, a pattern of a wiring or a separation width, which is required in a manufacturing process, tends to be micronized. Such a micronized pattern is formed by forming a resist pattern using a photolithography technique, and etching various base films using the resist pattern as a mask pattern (see, e.g., Japanese Patent Laid-Open Publication No. 2014-56864).

The photolithography technique is important in order to form a mask pattern, and it is now requested that micronization before and after a slimming processing do not exceed a resolution limit of the photolithography technique. A method of using a one-dimensional (1D) layout is known as a method of forming a fine mask pattern that does not exceed such a resolution limit of the photolithography technique.

The method of using the 1D layout includes a cut step of cutting a line or a space in a line-and-space shape, in which lines and spaces are repeated at an unmagnified pitch, at an optional position using a cut pattern. A pattern including a plurality of opening or a plurality of light shielding portions is used as the cut pattern.

SUMMARY

According to the present disclosure, there is provided a method for manufacturing a semiconductor device (hereinafter, also referred to as a "semiconductor device manufacturing method"). The semiconductor device manufacturing method includes: a first pattern forming step of forming, on a pattern forming target film, a first film that is patterned to have a first pattern that includes lines which are aligned with each other with spaces of a predetermined interval being interposed therebetween and include a portion separated by using a first cut mask; a step of forming a second film to cover a surface of the first film; and a second pattern forming step of forming a pattern forming target film that is patterned to have a second pattern by separating a portion of the spaces of the first pattern by using a second cut mask. The first cut mask includes a plurality of openings that have equal shapes, respectively, or a plurality of light shielding portions that have equal shapes, respectively, and the second cut mask includes a plurality of openings that have equal shapes, respectively, or a plurality of light shielding portions that have equal shapes, respectively.

The foregoing summary is illustrative only and is not intended to be in any way limiting. In addition to the illustrative aspects, embodiments, and the features described above, further aspects, embodiments, and features will become apparent by reference to the drawings and the following detailed description.

BRIEF DESCRIPTION OF THE DRAWINGS

FIGS. 28A to 28C are views (Part 9) for describing each step of the conventional semiconductor device manufacturing method according to the first exemplary embodiment of the present disclosure.

FIGS. 29A to 29C are views (Part 10) for describing each step of the conventional semiconductor device manufacturing method according to the first exemplary embodiment of the present disclosure.

DETAILED DESCRIPTION

Figure 1:
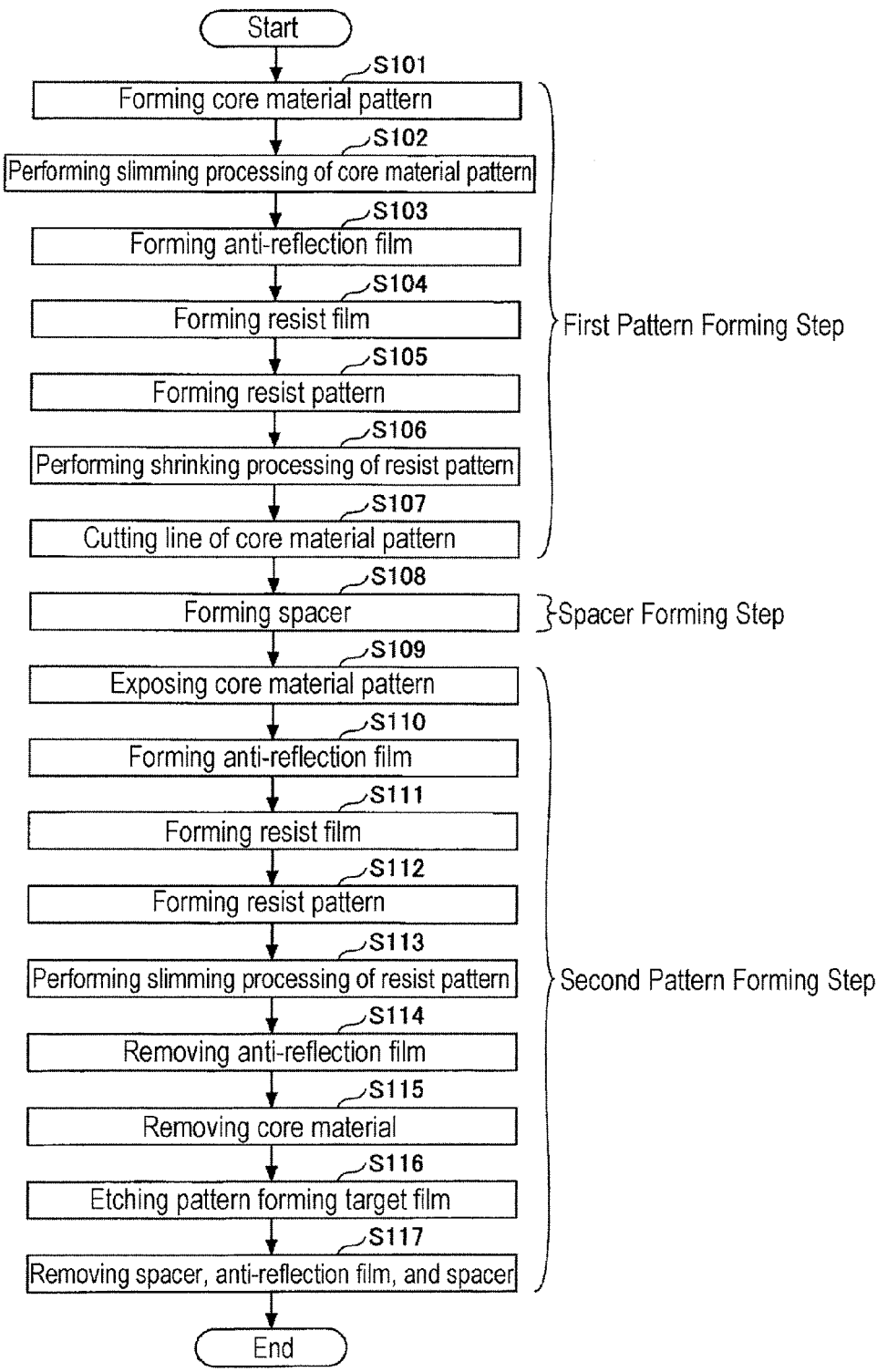
FIG. 1 is a flowchart exemplifying a semiconductor device manufacturing method according to a first exemplary embodiment of the present disclosure.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

While a high precision is required, in particular, in dimension and position of a cut pattern in a pattern forming that uses a 1D layout in a 10 nm or less node, it is difficult to increase the dimensional precision and the positional precision.

Therefore, an aspect of the present disclosure is to provide a semiconductor device manufacturing method that enables alleviation of the positional precision of a cut pattern that is requested in a pattern forming using a 1D layout.

According to the present disclosure, there is provided a method for manufacturing a semiconductor device. The semiconductor device manufacturing method includes: a first pattern forming step of forming, on a pattern forming target film, a first film that is patterned to have a first pattern that includes lines which are aligned with each other with spaces of a predetermined interval being interposed therebetween and include a portion separated by using a first cut mask; and a second pattern forming step of forming a pattern forming target film that is patterned to have a second pattern by separating a portion of the spaces of the first pattern using a second cut mask. The first cut mask includes a plurality of openings that have equal shapes, respectively, or a plurality of light shielding portions that have equal shapes, respectively, and the second cut mask includes a plurality of openings that have equal shapes, respectively, or a plurality of light shielding portions that have equal shapes, respectively.

The first cut mask includes a plurality of openings that have equal shapes, respectively. The second cut mask includes a plurality of light shielding portions that have equal shapes, respectively.

The first pattern forming step includes: forming a resist pattern; and forming the first cut mask by performing a shrinking processing or a slimming processing on the resist pattern so that the openings or the light shielding portions become smaller, and the second pattern forming step includes: forming a resist pattern; and forming the second cut mask by performing a shrinking processing or a slimming processing on the resist pattern such that the openings or the light shielding portions become smaller.

According to the present disclosure, it is possible to provide a semiconductor device manufacturing method that may alleviate the positional precision of a cut pattern, which is required in forming a pattern using a 1D layout.

Hereinafter, exemplary embodiments of the present disclosure will be described with reference to the accompanying drawings. In the specification and the drawings, components having substantially the same functions and configurations will be denoted by the same reference numerals, and redundant descriptions will be omitted.

First Exemplary Embodiment (Semiconductor Device Manufacturing Method)

Descriptions will be made on a semiconductor device manufacturing method according to a first exemplary embodiment. FIG. 1 is a flowchart exemplifying the semiconductor device manufacturing method according to the first exemplary embodiment.

The semiconductor device manufacturing method according to the first embodiment of the present disclosure includes a first pattern forming step, a spacer forming step, and a second pattern forming step, and performs the first pattern forming step, the spacer forming step, and the second pattern forming step in this order.

The first pattern forming step includes a step of forming a core material pattern (step S101), a step of performing a slimming processing of the core material pattern (step S102), a step of forming an anti-reflection film (step S103), a step of forming a resist film (step S104), a step of forming a resist pattern (step S105), a step of performing a shrinking processing on the resist pattern (step S106), and a step of cutting a line of the core material pattern (step S107).

The spacer forming step includes a step of forming a spacer (step S108).

The second pattern forming step includes a step of exposing the core material pattern (step S109), a step of forming an anti-reflection film (step S110), a step of forming a resist film (step S111), a step of forming a resist pattern (step S112), a step of performing a slimming processing of the resist pattern (step S113), a step of removing the anti-reflection film (step S114), a step of removing the core material (step S115), a step of etching a pattern forming target film (step S116), and a step of removing the spacer, the anti-reflection film, and the resist film (step S117).

Figure 2A:
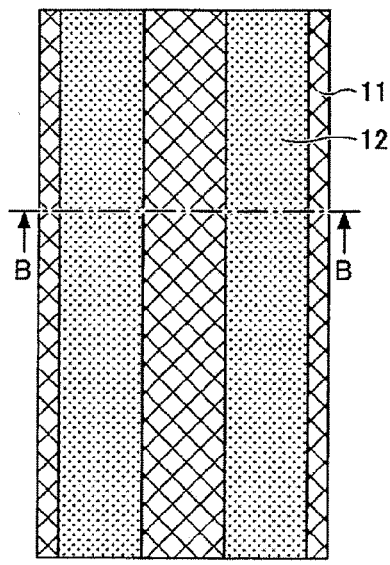
FIGS. 2A and 2B are views (Part 1) for describing each step of the semiconductor device manufacturing method according to the first exemplary embodiment of the present disclosure.
Figure 2B:
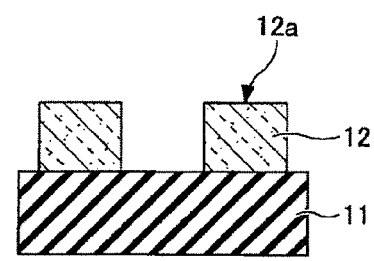
Figure 3A:
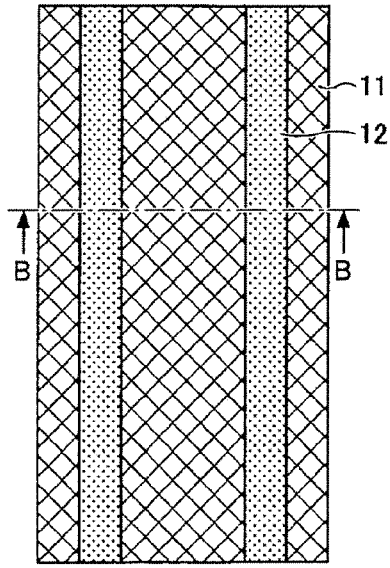
FIGS. 3A and 3B are views (Part 2) for describing each step of the semiconductor device manufacturing method according to the first exemplary embodiment of the present disclosure.
Figure 3B:
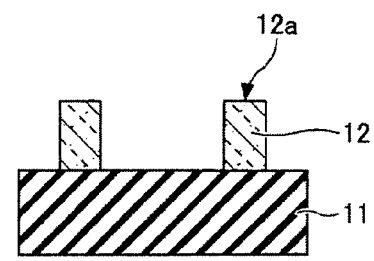
Figure 4A:
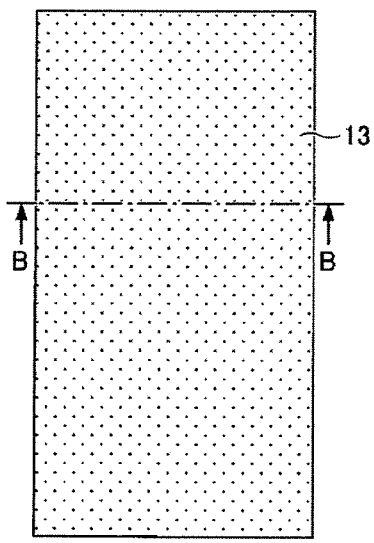
FIGS. 4A and 4B are views (Part 3) for describing each step of the semiconductor device manufacturing method according to the first exemplary embodiment of the present disclosure.

Hereinafter, each step will be described. FIGS. 2A and 2B to FIGS. 18A to 18C are views for describing respective steps of the semiconductor device manufacturing method according to the first exemplary embodiment. FIGS. 2A, 3A, 4A, . . . , and 18A are plan views illustrating a semiconductor device in respective steps, FIGS. 2B, 3B, 4B, . . . , and 18B are cross-sectional views taken along line B-B in FIGS. 2A, 3A, 4A, . . . , and 18A, respectively, and FIGS. 6C, 7C, 8C, . . . , and 18C are cross-sectional views taken along line C-C in FIGS. 6A, 7A, 8A, . . . , and 18A, respectively.

In step S101, a core material pattern is formed. More specifically, a core material 12 is formed on a pattern forming target film 11, for example, through chemical vapor deposition (CVD). The core material 12 is an example of the first film. Thereafter, as illustrated in FIGS. 2A and 2B, a core material pattern 12a, which is patterned in a line-and-space shape including lines that are aligned with each other with spaces of a predetermined interval being interposed therebetween, by exposure and development using ArF having a wavelength of, for example, 193 nm. The line width/line interval of the line-and-space shape may be set to, for example, 40 nm/40 nm. As the pattern forming target film 11, for example, an organic film may be used. As the core material 12, for example, a silicon film may be used.

In step S102, a slimming processing of the core material pattern is performed. More specifically, as illustrated in FIGS. 3A and 3B, the line width of the core material pattern 12a is thinned. The line width/line interval of the line-and-space shape of the core material pattern 12a after the slimming processing may be set to, for example, 20 nm/60 nm.

Figure 4B:
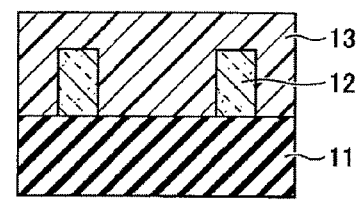

In step S103, an anti-reflection film is formed. More specifically, as illustrated in FIGS. 4A and 4B, an anti-reflection film 13 is formed on the pattern forming target film 11, which is formed with the core material pattern 12a, by, for example, spin coating. As the anti-reflection film 13, for example, an organic film such as, for example, a spin on carbon (SOC) film or an amorphous carbon film, may be used.

Figure 5A:
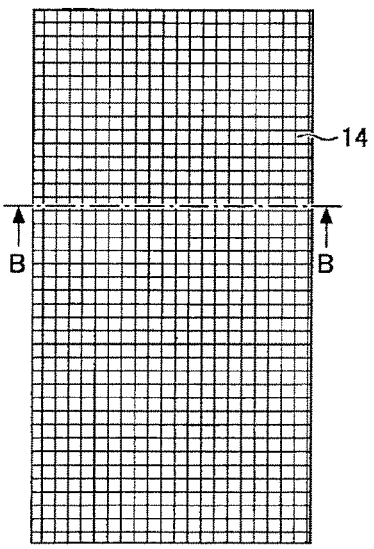
FIGS. 5A and 5B are views (Part 4) for describing each step of the semiconductor device manufacturing method according to the first exemplary embodiment of the present disclosure.
Figure 5B:
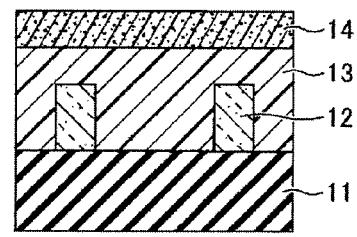

In step S104, a resist film is formed. More specifically, as illustrated in FIGS. 5A and 5B, a resist film 14 is formed on the anti-reflection film 13. As the material of the resist film 14, for example, a chemically amplified resist film may be used.

Figure 6A:
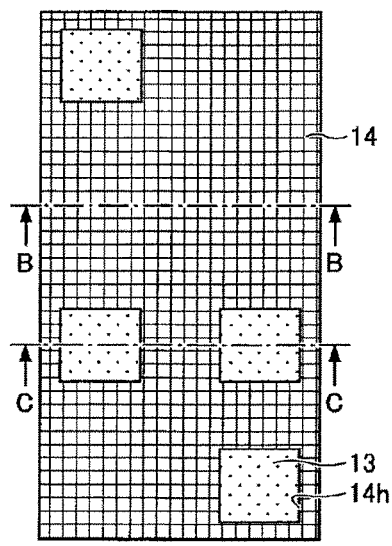
FIGS. 6A to 6C are views (Part 5) for describing each step of the semiconductor device manufacturing method, according to the first exemplary embodiment of the present disclosure.
Figure 6B:
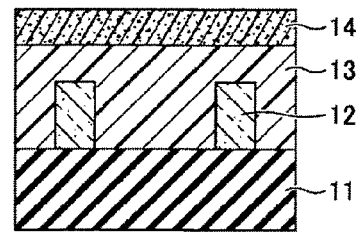
Figure 6C:
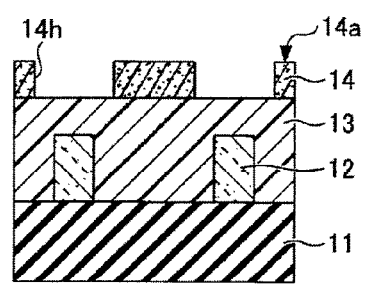
Figure 43A:
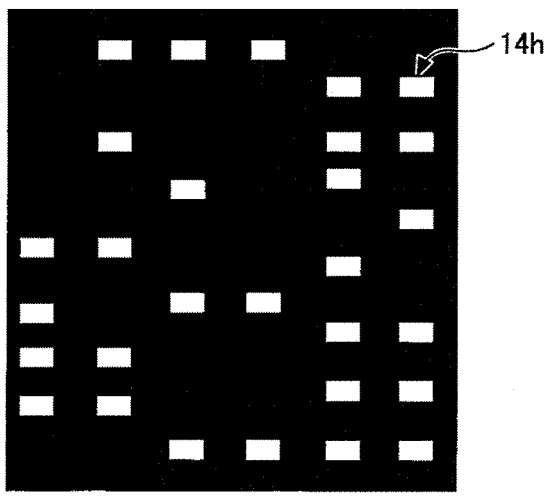
FIGS. 43A and 43B are views exemplifying shapes of cut patterns of the first exemplary embodiment of the present disclosure.
Figure 43B:
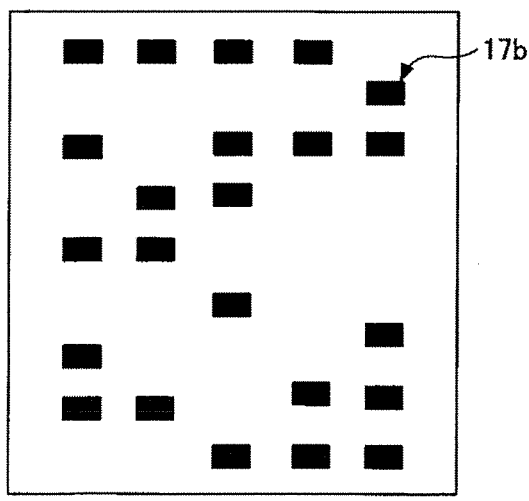

In step S105, a resist pattern is formed. More specifically, as illustrated in FIGS. 6A to 6C, a resist pattern 14a, which has a plurality of openings (hereinafter, referred as "holes 14h") at predetermined positions, are formed by exposure and development using ArF having a wavelength of for example, 193 nm. The holes 14h may be formed in, for example, a rectangular shape. As illustrated in FIGS. 43A and 43B to be described later, it is desired that the plurality of holes 14h have equal shapes, respectively. The reason why it is desired that the plurality of holes 14h have equal shapes, respectively, will be described later.

Figure 7A:
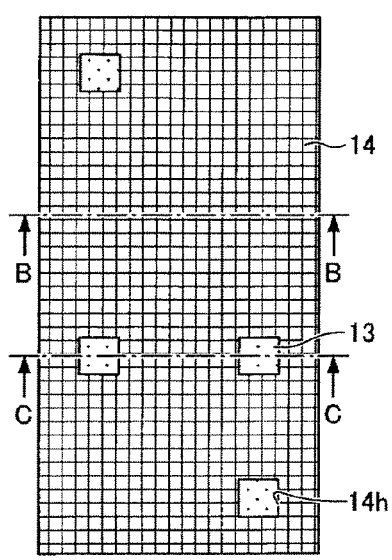
FIGS. 7A to 7C are views (Part 6) for describing each step of the semiconductor device manufacturing method according to the first exemplary embodiment of the present disclosure.
Figure 7B:
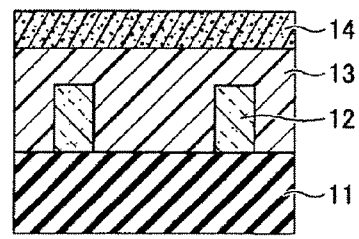
Figure 7C:
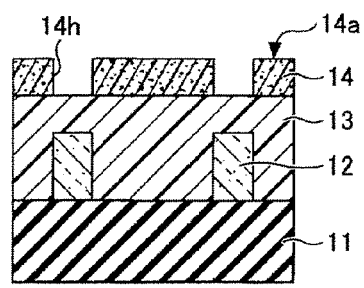

In step S106, a shrinking processing of the resist pattern is performed. More specifically, as illustrated in FIGS. 7A to 7C, the holes 14h formed in the resist film 14 become smaller by a shrinking agent. The shape of the holes 14h after the shrinking processing is not particularly limited so long as the shape includes a position at which the core material pattern 12a is subjected to line cut.

Figure 8A:
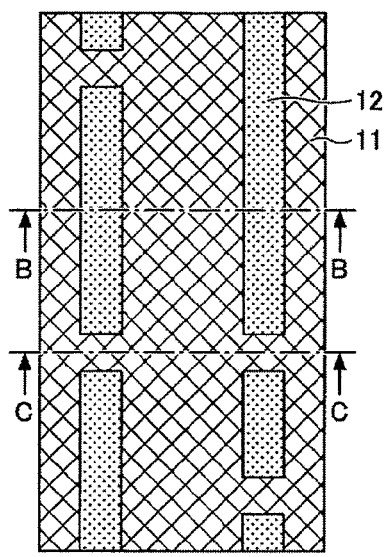
FIGS. 8A to 8C are views (Part 7) for describing each step of the semiconductor device manufacturing method according to the first exemplary embodiment of the present disclosure.
Figure 8B:
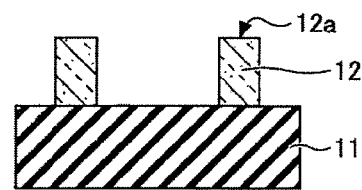
Figure 8C:

In step S107, a line of the core material pattern is cut. More specifically, as illustrated in FIGS. 8A to 8C, line cut etching of the core material pattern 12a, which is patterned in the line-and-space shape, is performed through anisotropic etching by, for example, reactive ion etching (RIE) by using the resist pattern 14a as a mask. Thereafter, the remaining anti-reflection film 13 and resist film 14 are removed.

According to the foregoing steps S101 to S107, the first pattern including lines, which include a separated portion, may be formed.

Figure 9A:
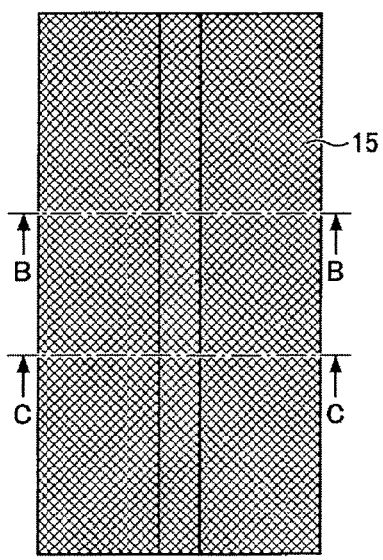
FIGS. 9A to 9C are views (Part 8) for describing each step of the semiconductor device manufacturing method according to the first exemplary embodiment of the present disclosure.
Figure 9B:
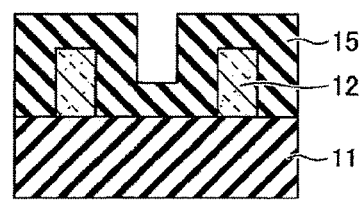
Figure 9C:
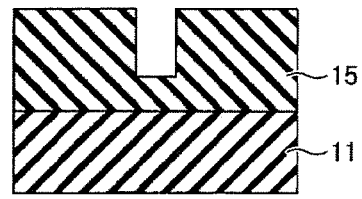

In step S108, a spacer is formed. More specifically, as illustrated in FIGS. 9A to 9C, a spacer 15 is formed on the pattern forming target film 11, which is formed with the core material pattern 12a having the first pattern, by, for example, CVD, to cover the surface of the core material pattern 12a. The spacer 15 is an example of the second film. As the spacer 15, for example, a silicon oxide ($SiO_2$) film may be used.

Figure 10A:
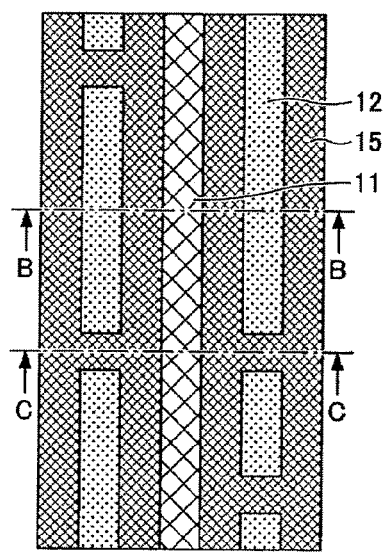
FIGS. 10A to 10C are views (Part 9) for describing each step of the semiconductor device manufacturing method according to the first exemplary embodiment of the present disclosure.
Figure 10B:
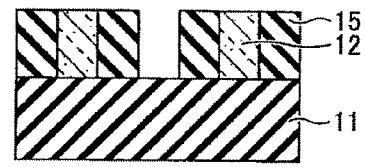
Figure 10C:
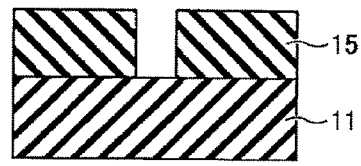

In step S109, the core material pattern is exposed. More specifically, as illustrated in FIGS. 10A to 10C, the spacer 15 is etched through anisotropic etching by, for example, RIE, until the core material pattern 12a is exposed.

Figure 11A:
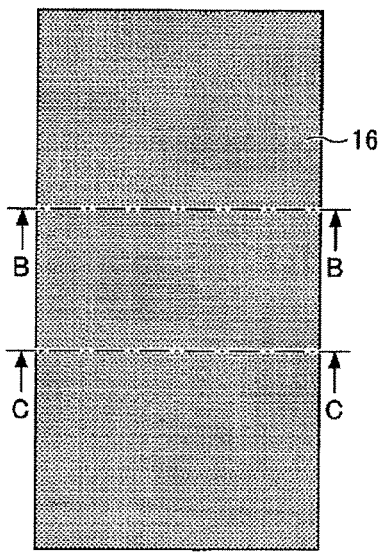
FIGS. 11A to 11C are views (Part 10) for describing each step of the semiconductor device manufacturing method according to the first exemplary embodiment of the present disclosure.
Figure 11B:
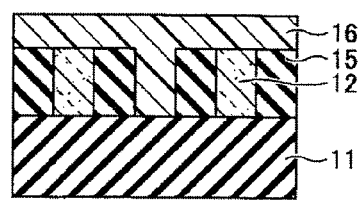
Figure 11C:
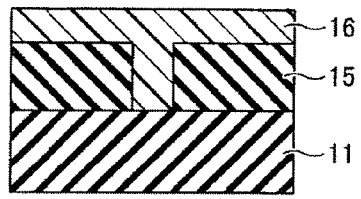

In step S110, an anti-reflection film is formed. More specifically, as illustrated in FIGS. 11A to 11C, an anti-reflection film 16 is formed on the pattern forming target film 11, which is formed with the core material pattern 12a and the spacer 15, by, for example, spin coating. As the anti-reflection film 16, for example, an organic film such as, for example, an amorphous carbon film may be used. In addition, the anti-reflection film 16 may be the same as or different from that used in step S103.

Figure 12A:
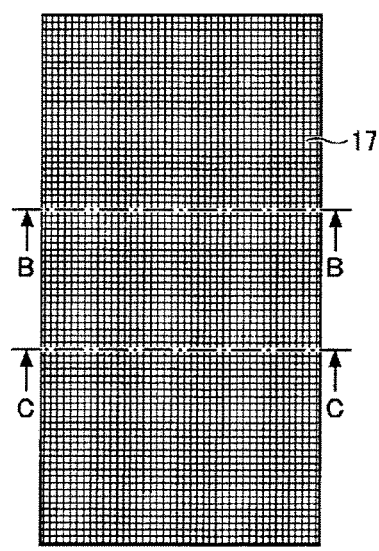
FIGS. 12A to 12C are views (Part 11) for describing each step of the semiconductor device manufacturing method according to the first exemplary embodiment of the present disclosure.
Figure 12B:
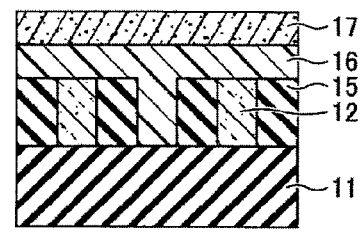
Figure 12C:
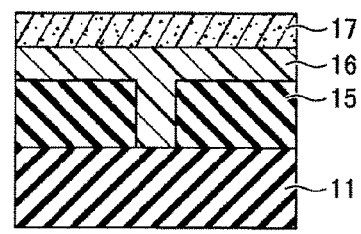

In step S111, a resist film is formed. More specifically, as illustrated in FIGS. 12A to 12C, a resist film 17 is formed on the anti-reflection film 16. As the material of the resist film 17, for example, a chemically amplified resist film may be used. In addition, the material of the resist film 17 may be the same as or different from that used in step S104.

Figure 13A:
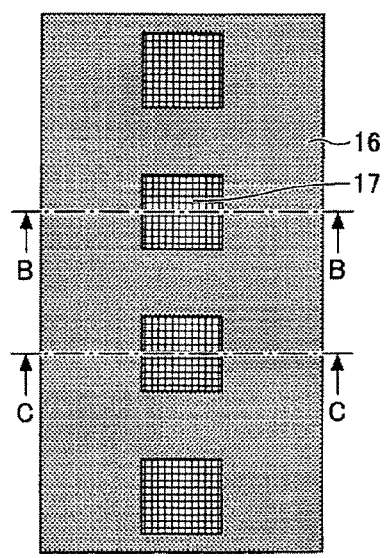
FIGS. 13A to 13C are views (Part 12) for describing each step of the semiconductor device manufacturing method according to the first exemplary embodiment of the present disclosure.
Figure 13B:
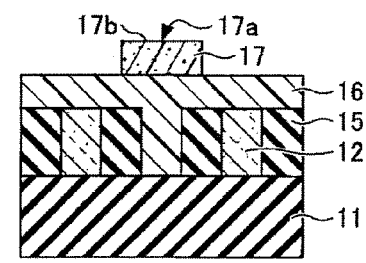
Figure 13C:
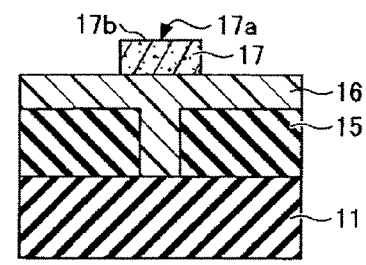

In step S112, a resist pattern is formed. More specifically, as illustrated in FIGS. 13A to 13C, a resist pattern 17a, which has a plurality of light shielding portions (hereinafter, referred as "blocks 17b") at predetermined positions, are formed by exposure and development using ArF having a wavelength of, for example, 193 nm. The blocks 17b may be formed in, for example, a rectangular shape. It is desired that the plurality of blocks 17b have equal shape, respectively. The reason why it is desired that the plurality of blocks 17h have equal shapes, respectively, will be described later.

Figure 14A:
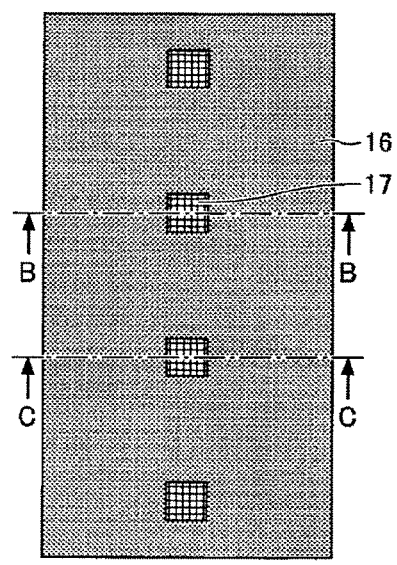
FIGS. 14A to 14C are views (Part 13) for describing each step of the semiconductor device manufacturing method according to the first exemplary embodiment of the present disclosure.
Figure 14B:
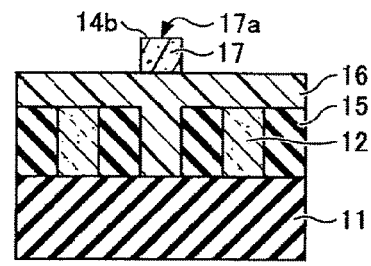
Figure 14C:
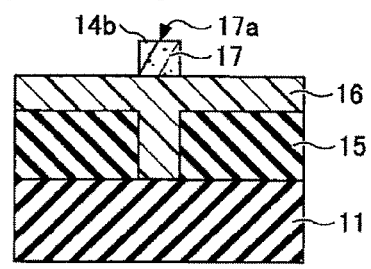

In step S113, a slimming processing of the resist pattern is performed. More specifically, as illustrated in FIGS. 14A to 14C, the blocks 17b of the core material pattern 17a become smaller, for example, by performing a heat treatment. The shape of the blocks 17b after the slimming processing is not particularly limited so long as the shape includes a position at which the core material pattern 12a is subjected to space cut.

Figure 15A:
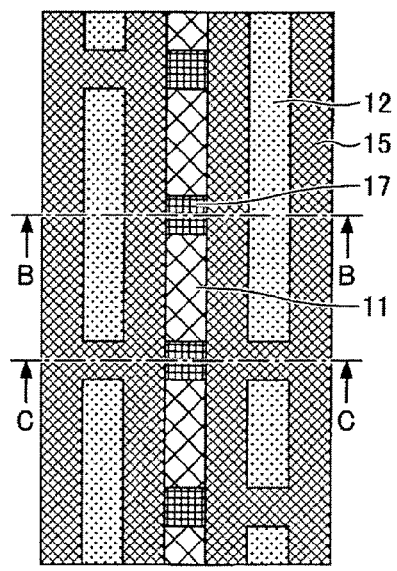
FIGS. 15A to 15C are views (Part 14) for describing each step of the semiconductor device manufacturing method according to the first exemplary embodiment of the present disclosure.
Figure 15B:
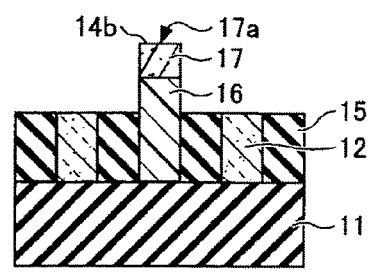
Figure 15C:
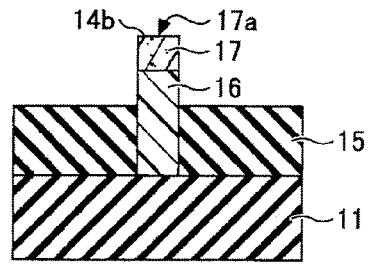

In step S114, an anti-reflection film is formed. More specifically, as illustrated in FIGS. 15A to 15C, the anti-reflection film 16 is removed through anisotropic etching by, for example, RIE, by using the core material pattern 17a as a mask.

Figure 16A:
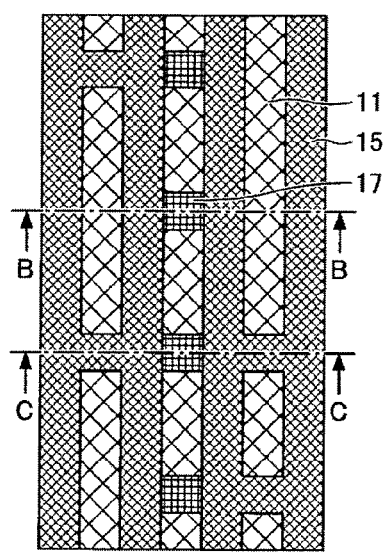
FIGS. 16A to 16C are views (Part 15) for describing each step of the semiconductor device manufacturing method according to the first exemplary embodiment of the present disclosure.
Figure 16B:
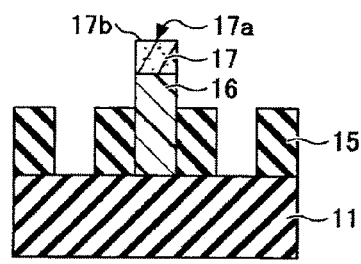
Figure 16C:
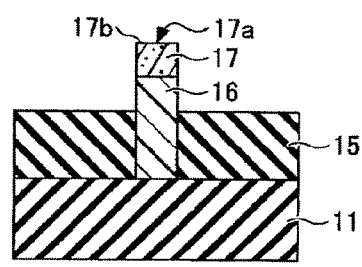

In step S115, the core material is removed. More specifically, as illustrated in FIGS. 16A to 16C, the spacer 12 is etched through anisotropic etching by, for example, RIE.

Figure 17A:
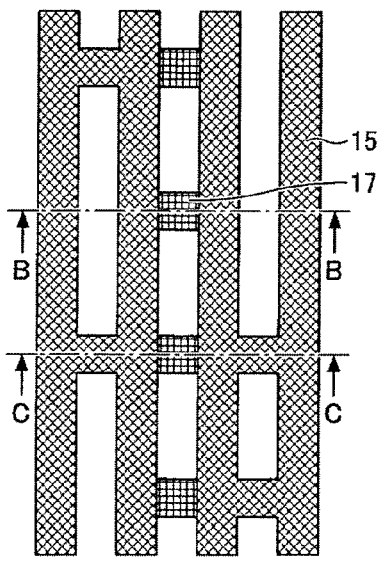
FIGS. 17A to 17C are views (Part 16) for describing each step of the semiconductor device manufacturing method according to the first exemplary embodiment of the present disclosure.
Figure 17B:
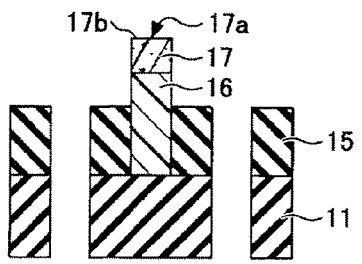
Figure 17C:
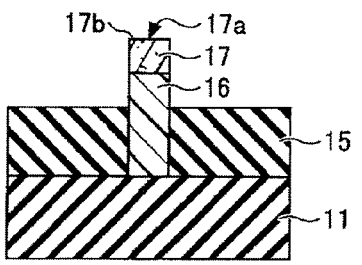

In step S116, a pattern forming target film is etched. More specifically, as illustrated in FIGS. 17A to 17C, the pattern forming target film 11 is removed through anisotropic etching by, for example, RIE, by using the spacer 15 and the resist film 17 as a mask.

Figure 18A:
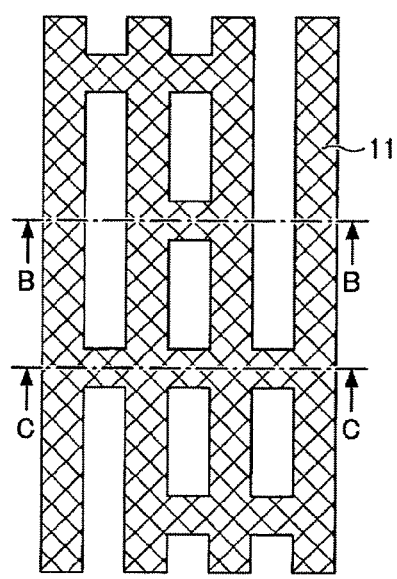
FIGS. 18A to 18C are views (Part 17) for describing each step of the semiconductor device manufacturing method according to the first exemplary embodiment of the present disclosure.
Figure 18B:
Figure 18C:
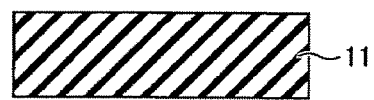

In step S117, the spacer, the anti-reflection film, and the resist film are removed. More specifically, as illustrated in FIGS. 18A to 18C, the spacer 15, the anti-reflection film 16, and the resist film 17, which remain on the pattern forming target film 11, are removed through anisotropic etching by, for example, RIE.

According to the foregoing steps S109 to S117, the second pattern may be formed.

In addition, the semiconductor device manufacturing method according to the first exemplary embodiment of the present disclosure may further include a step of forming a third pattern by reversing the second pattern. In such a case, at least two layers of films (a first pattern forming target film and a second pattern forming target film) are used as pattern forming target films 11.

More specifically, a reverse film, which is formed of, for example, an amorphous carbon film or a silicon film, is formed to bury a space of the first pattern forming target film that is formed with the second pattern, and then, the first pattern forming target film is removed by, for example, wet etching.

Subsequently, the remaining reverse film is used as a hard mask pattern of a third pattern that is a reversed pattern of the second pattern. In addition, the third pattern 3 is formed on the second pattern forming target film through anisotropic etching by, for example, RIE, by using the hard mask film as a mask. By this, the third pattern, which is the reversed pattern of the second pattern, may be formed.

Conventional Example

Figure 19:
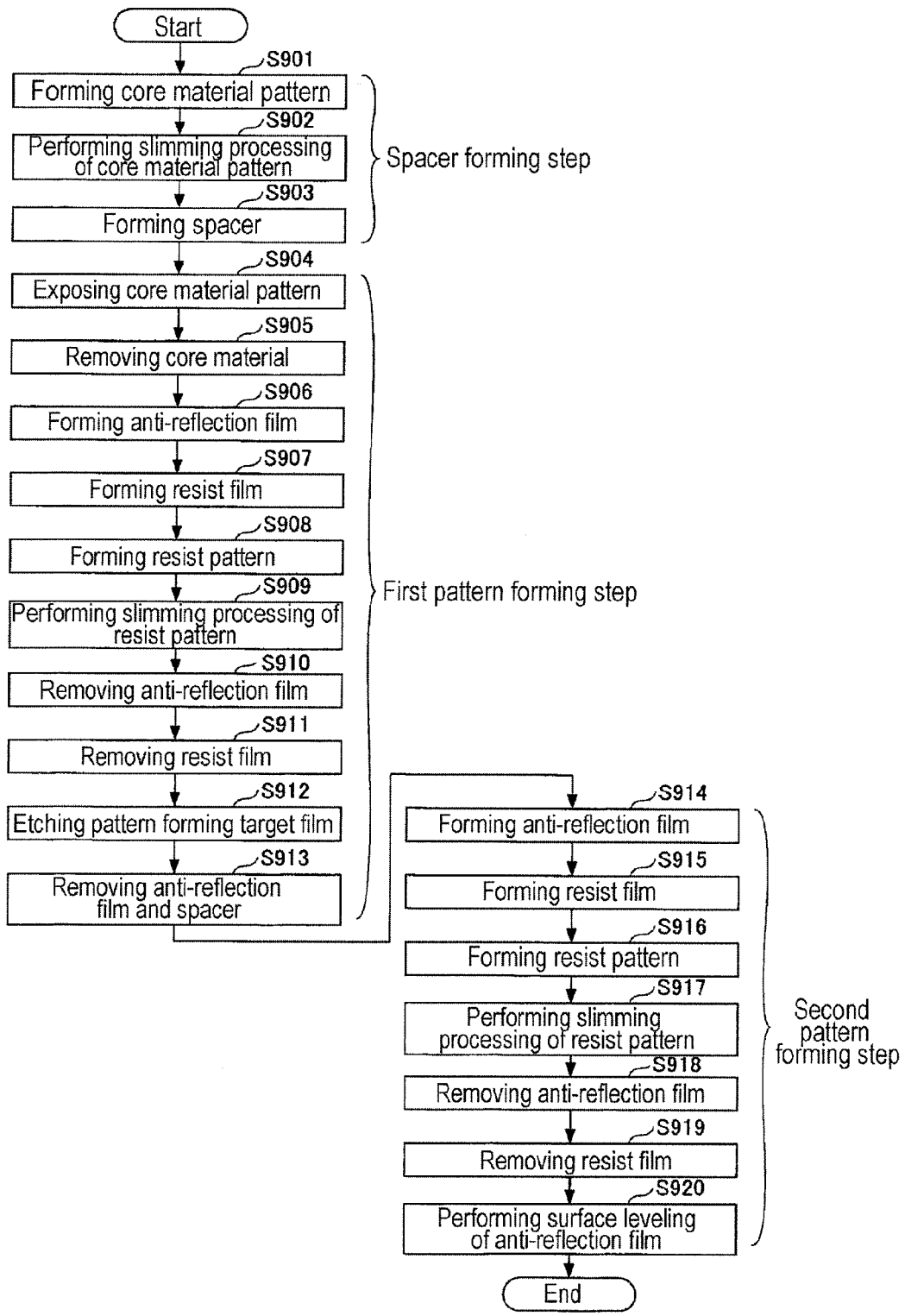
FIG. 19 is a flowchart exemplifying a conventional semiconductor device manufacturing method.

Descriptions will be made on a conventional semiconductor device manufacturing method in comparison with the semiconductor device manufacturing method according to the first exemplary embodiment of the present disclosure. FIG. 19 is a flowchart exemplifying a conventional semiconductor device manufacturing method.

The conventional semiconductor device manufacturing method is different from the semiconductor device manufacturing method according to the first exemplary embodiment of the present disclosure in that the first pattern forming step and the second pattern forming step are performed in this order, after performing the spacer forming step.

The spacer forming step includes a step of forming a core material pattern (step S901), a step of performing a sliming processing of the core material pattern (step S902), and a step of forming a spacer (step S903).

The first pattern forming step includes a step of exposing the core material pattern (step S904), a step of removing the core material (step S905), a step of forming an anti-reflection film (step S906), a step of forming a resist film (step S907), a step of forming a resist pattern (step S908), a step of performing a slimming processing of the resist pattern (step S909), a step of removing the anti-reflection film (step S910), a step of removing the resist film (step S911), a step of etching a pattern forming target film (step S912), and a step of removing the anti-reflection film and the spacer (step S913).

The second pattern forming step includes a step of forming an anti-reflection film (step S914), a step of forming a resist film (step S915), a step of forming a resist pattern (step S916), a step of performing a slimming processing of the resist pattern (step S917), a step of removing the anti-reflection film (step S918), a step of removing the resist film (step S919), and a step of performing surface leveling of the anti-reflection film (step S920).

Figure 20A:
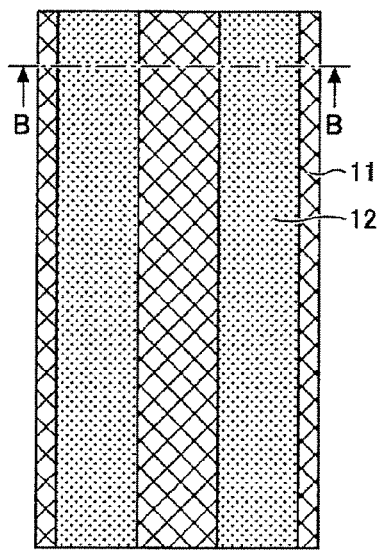
FIGS. 20A and 20B are views (Part 1) for describing each step of the conventional semiconductor device manufacturing method according to the first exemplary embodiment of the present disclosure.
Figure 20B:
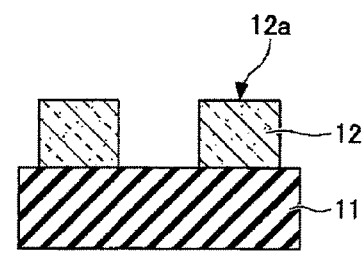
Figure 21A:
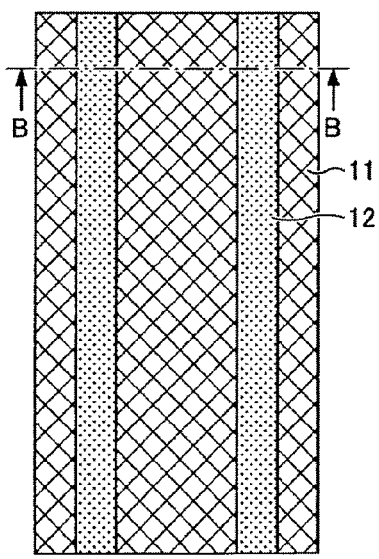
FIGS. 21A and 21B are views (Part 2) for describing each step of the conventional semiconductor device manufacturing method according to the first exemplary embodiment of the present disclosure.
Figure 21B:
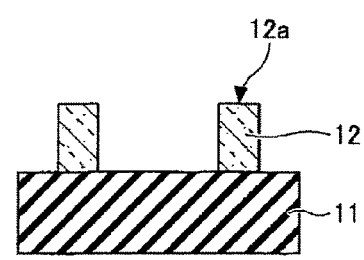
Figure 22A:
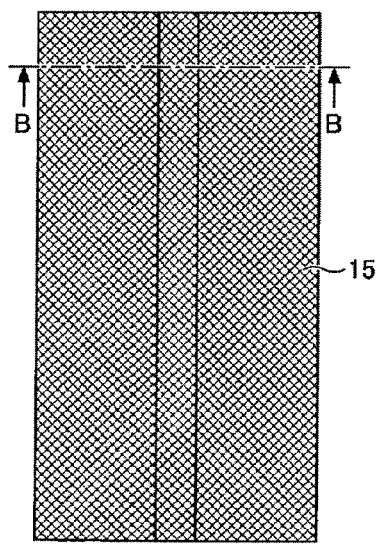
FIGS. 22A and 22B are views (Part 3) for describing each step of the conventional semiconductor device manufacturing method according to the first exemplary embodiment of the present disclosure.
Figure 35A:
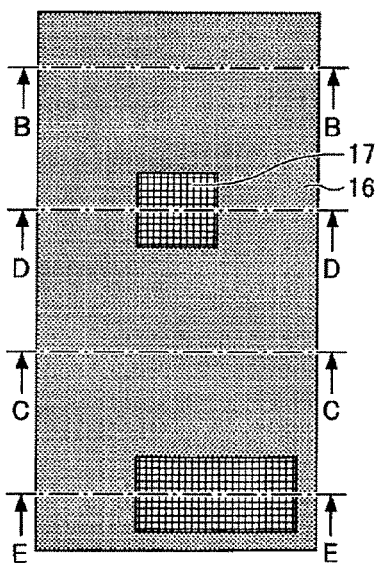
FIGS. 35A to 35E are views (Part 16) for describing each step of the conventional semiconductor device manufacturing method according to the first exemplary embodiment of the present disclosure.
Figure 35B:
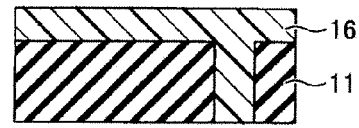
Figure 35C:
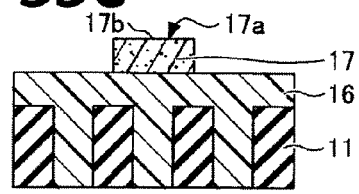
Figure 35D:
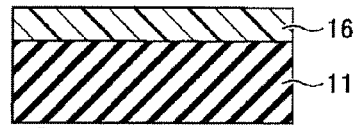
Figure 35E:
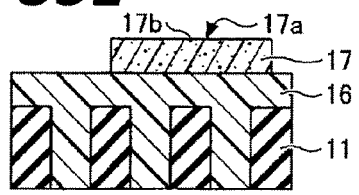
Figure 36A:
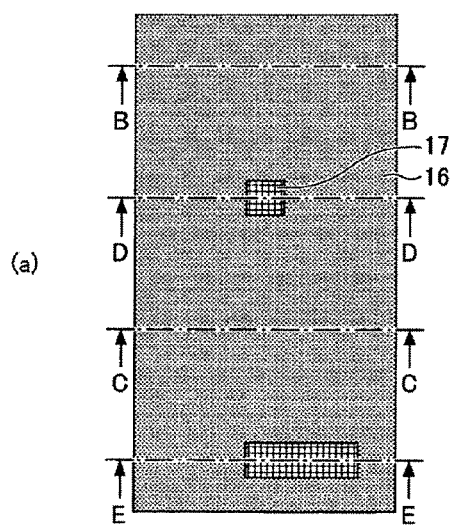
FIGS. 36A to 36E are views (Part 17) for describing each step of the conventional semiconductor device manufacturing method according to the first exemplary embodiment of the present disclosure.
Figure 36B:
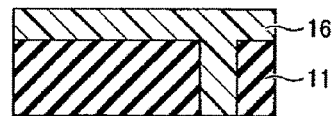
Figure 36C:
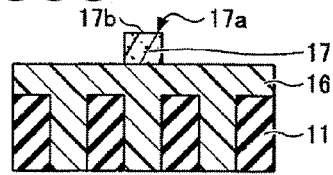
Figure 36D:
Figure 36E:
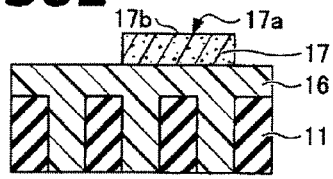
Figure 37A:
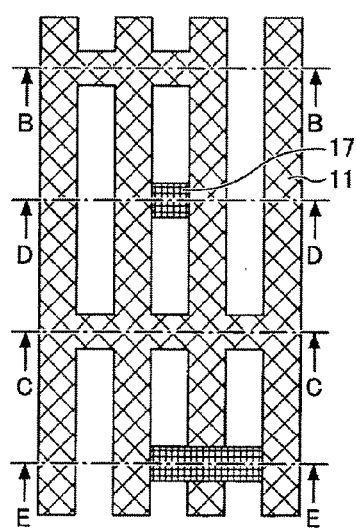
FIGS. 37A to 37E are views (Part 19) for describing each step of the conventional semiconductor device manufacturing method according to the first exemplary embodiment of the present disclosure.
Figure 37B:
Figure 37C:
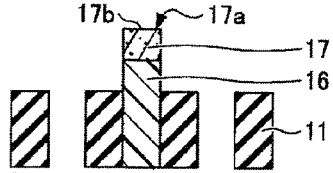
Figure 37D:
Figure 37E:
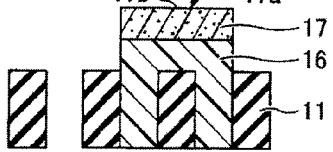
Figure 38A:
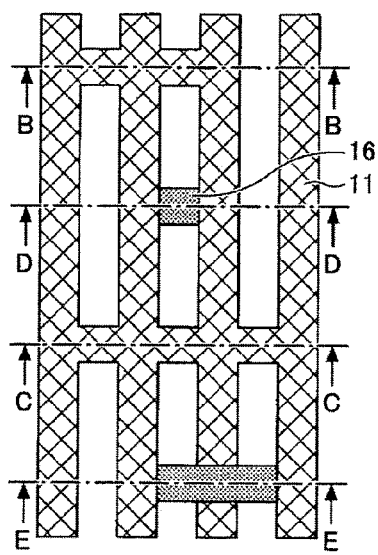
FIGS. 38A to 38E are views (Part 20) for describing each step of the conventional semiconductor device manufacturing method according to the first exemplary embodiment of the present disclosure.
Figure 38B:
Figure 38C:
Figure 38D:
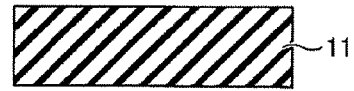
Figure 38E:
Figure 39A:
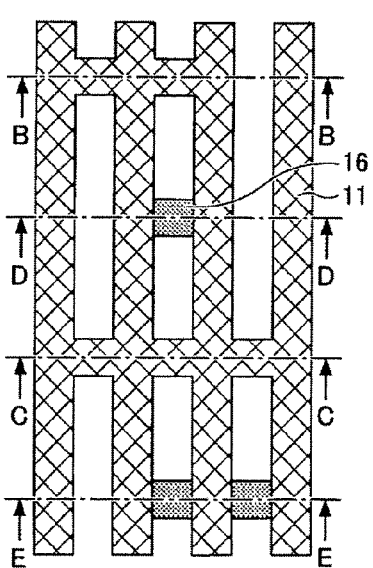
FIGS. 39A to 39E are views (Part 21) for describing each step of the conventional semiconductor device manufacturing method according to the first exemplary embodiment of the present disclosure.
Figure 39B:
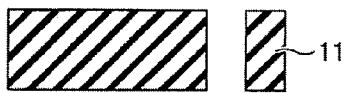
Figure 39C:
Figure 39D:
Figure 39E:
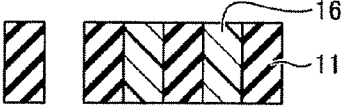

Hereinafter, each step will be described. FIGS. 20A to 20B to FIGS. 39A to 39E are views for describing respective steps of the conventional semiconductor device manufacturing method. FIGS. 20A, 21A, 22A, . . . , and 39A are plan views illustrating a semiconductor device in respective steps, FIGS. 20B, 21B, 22B, . . . , and 39B are cross-sectional views taken along line B-B in FIGS. 20A, 21A, 22A, . . . , and 39A, respectively, and FIGS. 27C, 28C, 29C, . . . , and 39C are cross-sectional views taken along line C-C in FIGS. 27A, 28A, 29A, . . . , and 39A, respectively. In addition, FIGS. 35D, 36D, . . . , and 39D are cross-sectional views taken along line D-D in FIGS. 35A, 36A, . . . , and 39A, respectively, and FIGS. 35E, 36E, . . . , and 39E are cross-sectional views taken along line E-E in FIGS. 35A, 36A, . . . , and 39A, respectively.

In step S901, a core material pattern is formed. More specifically, as illustrated in FIGS. 20A and 20B, it may be said that step S901 is the same as step S101 of the first exemplary embodiment.

In step S902, a slimming processing of the core material pattern is performed. More specifically, as illustrated in FIGS. 21A and 21B, it may be said that step S902 is the same as step S102 of the first exemplary embodiment.

Figure 22B:
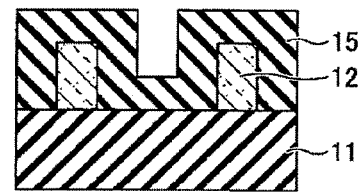

In step S903, a spacer is formed. More specifically, as illustrated in FIGS. 22A and 22B, a spacer 15 is formed on the pattern forming target film 11, which is formed with the core material pattern 12a, by, for example, CVD.

Figure 23A:
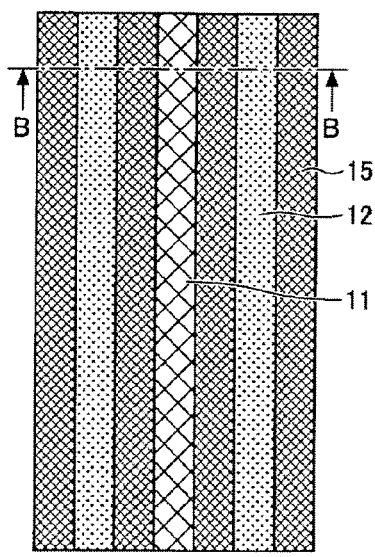
FIGS. 23A and 23B are views (Part 4) for describing each step of the conventional semiconductor device manufacturing method according to the first exemplary embodiment of the present disclosure.
Figure 23B:
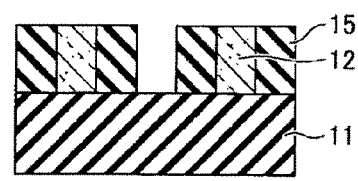

In step S904, the core material pattern is exposed. More specifically, as illustrated in FIGS. 23A and 23B, the spacer 15 is etched through anisotropic etching by, for example, RIE, until the core material pattern 12a is exposed.

Figure 24A:
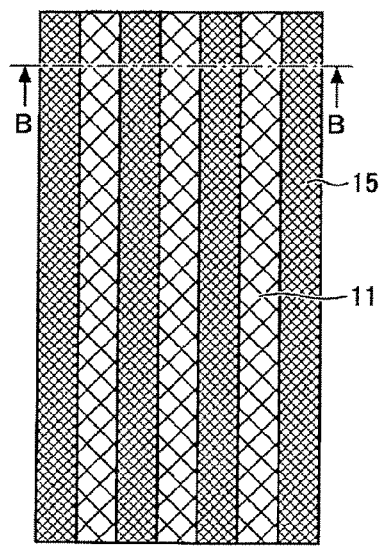
FIGS. 24A and 24B are views (Part 5) for describing each step of the conventional semiconductor device manufacturing method according to the first exemplary embodiment of the present disclosure.
Figure 24B:
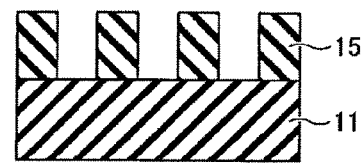

In step S905, the core material is removed. More specifically, as illustrated in FIGS. 24A and 24B, the spacer material 12 is removed through anisotropic etching by, for example, RIE.

Figure 25A:
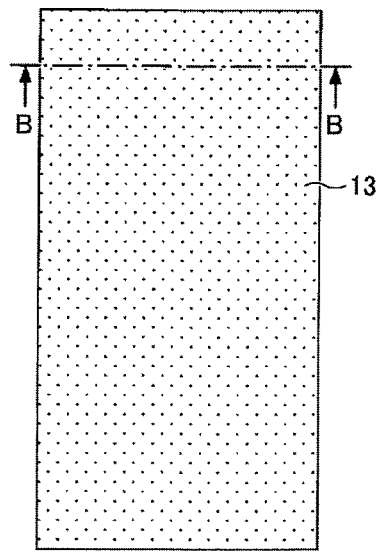
FIGS. 25A and 25B are views (Part 6) for describing each step of the conventional semiconductor device manufacturing method according to the first exemplary embodiment of the present disclosure.
Figure 25B:
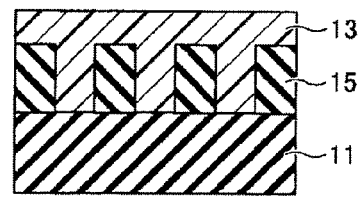

In step S906, an anti-reflection film is formed. More specifically, as illustrated in FIGS. 25A and 25B, an anti-reflection film 13 is formed on the pattern forming target film 11, which is formed with the core material pattern 12a, by, for example, spin coating.

Figure 26A:
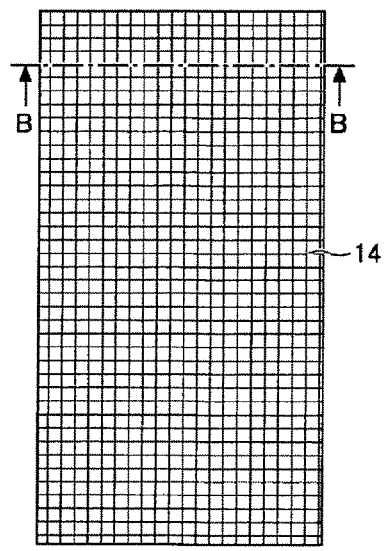
FIGS. 26A and 26B are views (Part 7) for describing each step of the conventional semiconductor device manufacturing method according to the first exemplary embodiment of the present disclosure.
Figure 26B:
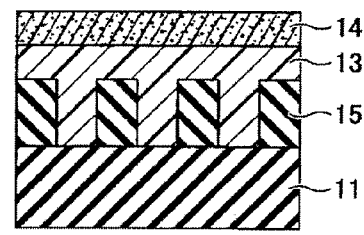

In step S907, a resist film is formed. More specifically, as illustrated in FIGS. 26A and 26B, a resist film 14 is formed on the anti-reflection film 13.

Figure 27A:
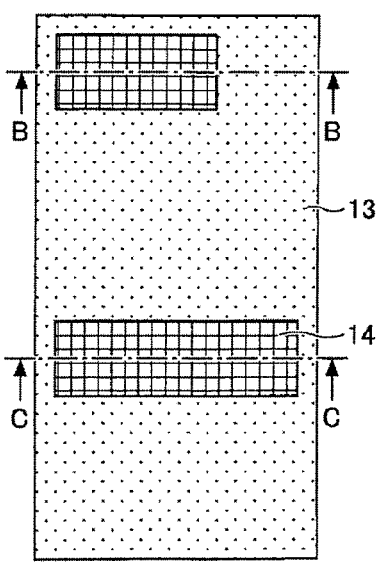
FIGS. 27A to 27C are views (Part 8) for describing each step of the conventional semiconductor device manufacturing method according to the first exemplary embodiment of the present disclosure.
Figure 27B:
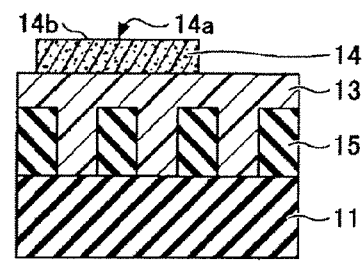
Figure 27C:
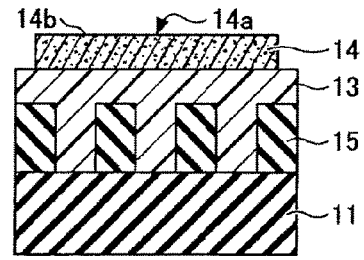

In step S908, a resist pattern is formed. More specifically, as illustrated in FIGS. 27A to 27C, a resist pattern 14a, which has a plurality of blocks 14b at predetermined positions, are formed by exposure and development using ArF having a wavelength of, for example, 193 nm.

In step S909, a slimming processing of the resist pattern is performed. More specifically, as illustrated in FIGS. 28A to 28C, the blocks 14h formed on the resist film 14 become smaller, for example, by performing a heat treatment.

In step S910, an anti-reflection film is removed. More specifically, as illustrated in FIGS. 29A to 29C, the anti-reflection film 13 is removed through anisotropic etching by, for example, RIE, by using the resist pattern 14a as a mask.

Figure 30A:
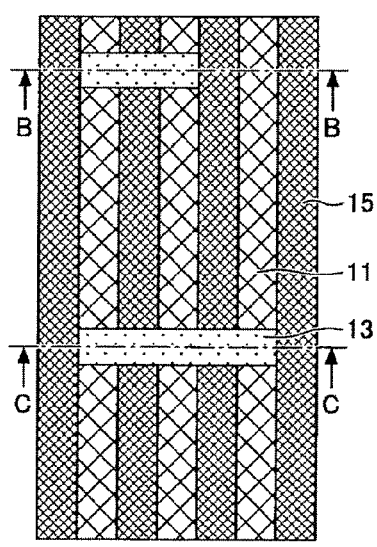
FIGS. 30A to 30C are views (Part 11) for describing each step of the conventional semiconductor device manufacturing method according to the first exemplary embodiment of the present disclosure.
Figure 30B:
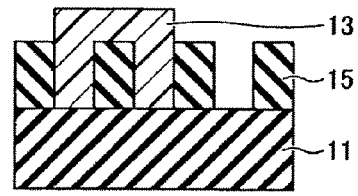
Figure 30C:
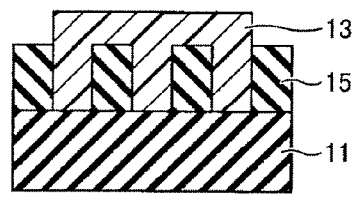

In step S911, the resist film is removed. More specifically, as illustrated in FIGS. 30A to 30C, the resist film 14 remaining on the anti-reflection film 13 is removed.

Figure 31A:
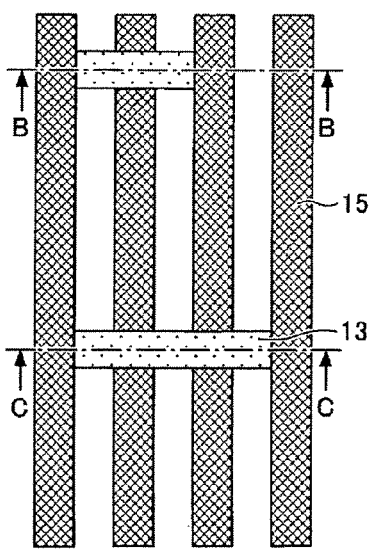
FIGS. 31A to 31C are views (Part 12) for describing each step of the conventional semiconductor device manufacturing method according to the first exemplary embodiment of the present disclosure.
Figure 31B:
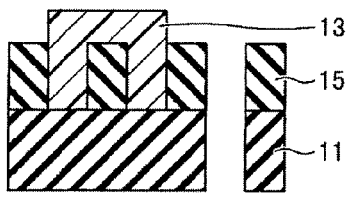
Figure 31C:
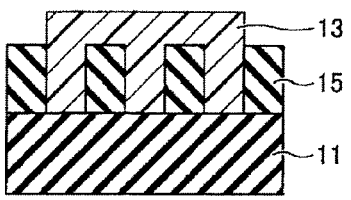

In step S912, the pattern forming target film is etched. More specifically, as illustrated in FIGS. 31A to 31C, the pattern forming target film 11 is removed through anisotropic etching by, for example, RIE, by using the spacer 13 and the resist film 15 as a mask.

Figure 32A:
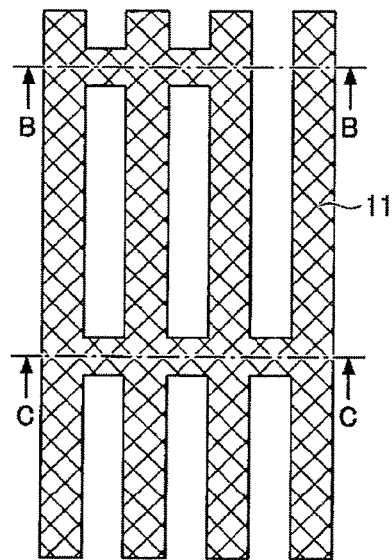
FIGS. 32A to 32C are views (Part 13) for describing each step of the conventional semiconductor device manufacturing method according to the first exemplary embodiment of the present disclosure.
Figure 32B:
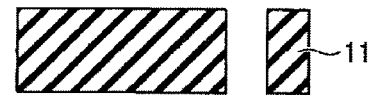
Figure 32C:

In step S913, the anti-reflection film and the spacer are removed. More specifically, as illustrated in FIGS. 32A to 32C, the anti-reflection film 13 and the spacer 15, which remain on the pattern forming target film 11, are removed through anisotropic etching by, for example, RIE.

According to the foregoing steps S904 to S913, the first pattern may be formed.

Figure 33A:
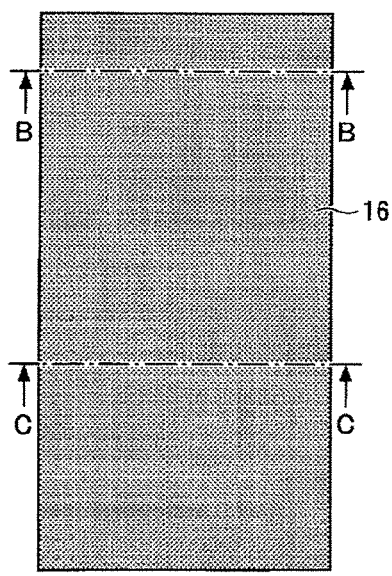
FIGS. 33A to 33C are views (Part 14) for describing each step of the conventional semiconductor device manufacturing method according to the first exemplary embodiment of the present disclosure.
Figure 33B:
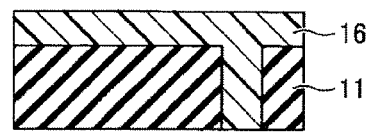
Figure 33C:
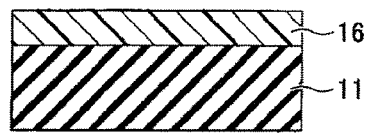

In step S914, an anti-reflection film is formed. More specifically, as illustrated in FIGS. 33A to 33C, an anti-reflection film 16 is formed on the pattern forming target film 11, which is formed with the pattern 11, by, for example, spin coating.

Figure 34A:
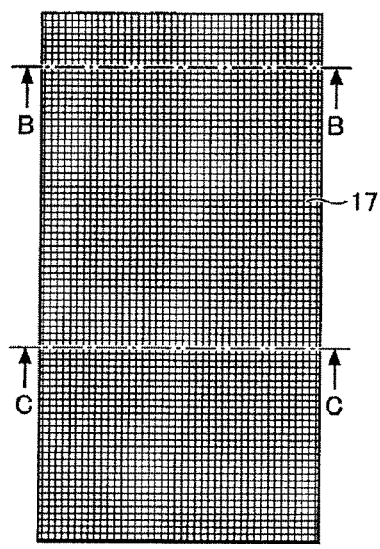
FIGS. 34A to 34C are views (Part 15) for describing each step of the conventional semiconductor device manufacturing method according to the first exemplary embodiment of the present disclosure.
Figure 34B:
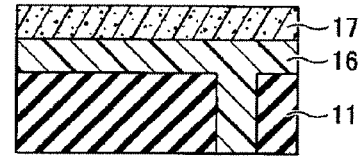
Figure 34C:
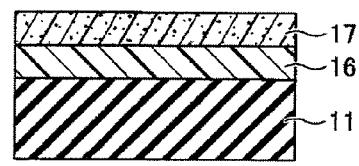

In step S915, a resist film is formed. More specifically, as illustrated in FIGS. 34A to 34C, a resist film 17 is formed on the anti-reflection film 16.

In step S916, a resist pattern is formed. More specifically, as illustrated in FIGS. 35A to 35E, a resist pattern 17a, which has a plurality of blocks 17b at predetermined positions, is formed by exposure and development using ArF having a wavelength of, for example, 193 nm.

In step S917, a slimming processing of the resist pattern is performed. More specifically, as illustrated in FIGS. 36A to 36E, the blocks 17b of the resist pattern 17a become, for example, by performing a heat treatment.

In step S918, the anti-reflection film is removed. More specifically, as illustrated in FIGS. 37A to 37E, the anti-reflection film 16 is removed through anisotropic etching by, for example, RIE, by using the resist pattern 17a as a mask.

In step S919, the resist film is removed. More specifically, as illustrated in FIGS. 38A to 38E, the resist film 17 remaining on the anti-reflection film 16 is removed.

In step S920, the anti-reflection film is subjected to surface leveling. More specifically, as illustrated in FIGS. 39A to 39E, the anti-reflection film 16 protruding from the surface of the pattern forming target film 11 is removed through anisotropic etching by, for example, RIE.

By the foregoing steps S914 to S920, the second pattern may be formed.

Action and Effect

Descriptions will be made on actions and effects of the semiconductor device manufacturing method according to the first exemplary embodiment.

Figure 40A:
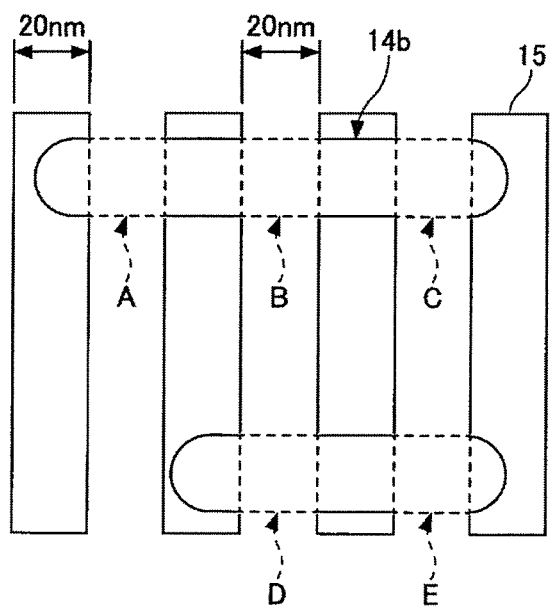
FIGS. 40A and 40B are views for describing a positional precision that is required in a conventional cut pattern.
Figure 40B:
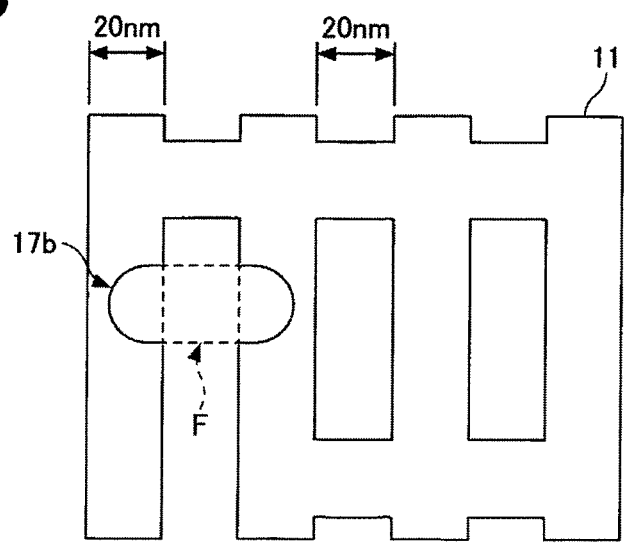
Figure 41A:
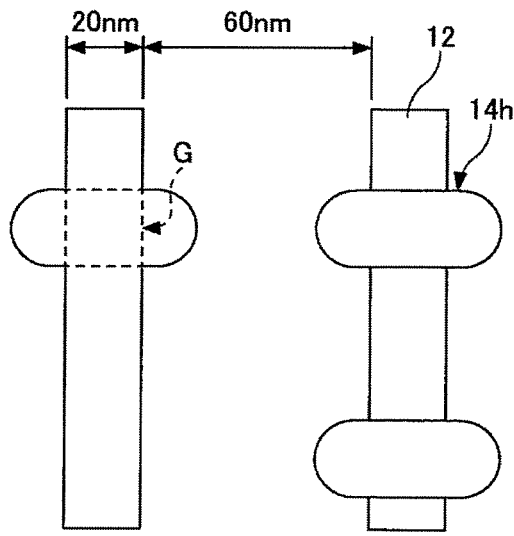
FIGS. 41A and 41B are views for describing a positional precision that is required for a cut pattern of the first exemplary embodiment of the present disclosure.
Figure 41B:
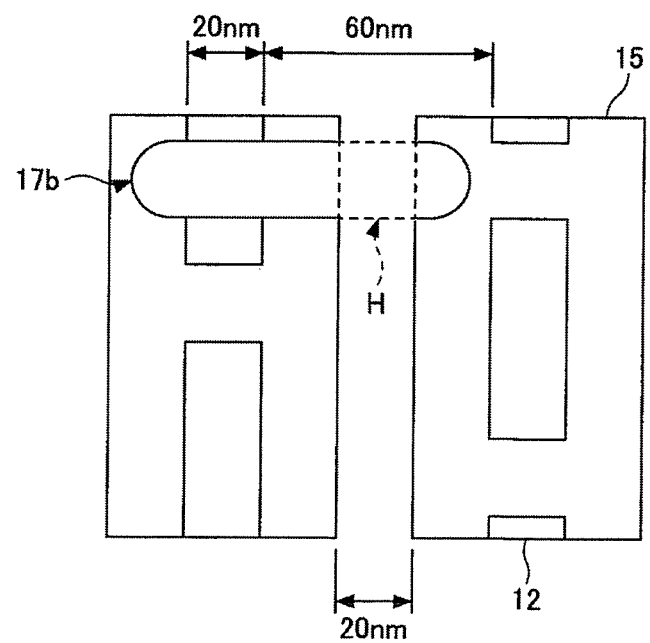

First, descriptions will be made on a positional precision that is required for a cut pattern. FIGS. 40A and 40B are views for describing a positional precision that is required for a conventional cut pattern. FIGS. 41A and 41B are views for describing a positional precision that is required for a cut pattern of the first exemplary embodiment of the present disclosure.

More specifically, FIGS. 40A and 40B are views for describing a positional precision that is required for a cut pattern in the conventional first and second pattern forming steps, respectively. More specifically, FIGS. 41A and 41B are views for describing a positional precision that is required for a cut pattern in the first pattern forming step and the second pattern forming step of the first exemplary embodiment, respectively.

In the conventional pattern forming step, when forming the first pattern, a plurality of blocks 14b are provided at predetermined positions in order to cut interline-spaces of a spacer having a line-and-space shape. At this time, in order to prevent a space, which is not an object to be cut, from being cut, it is necessary to determine the length of the blocks 14b of the cut pattern. For example, as illustrated in FIG. 40A, in the case of cutting the portion indicated by regions A, B, and C in the spaces, it is necessary to determine the cut pattern such that the block 14b of the cut pattern includes regions A, B, and C, the left protrusion portion of region A has a length of 20 nm or less not to overlap with an adjacent line, and the right protrusion portion of region C has a length of 20 nm or less not to overlap with an adjacent line. In addition, for example, in the case of cutting the portions indicated by regions D and E in the spaces, it is necessary to determine the cut pattern such that the block 14b of the cut pattern includes regions D and E, the left protrusion portion of region D has a length of 20 nm or less not to overlap with an adjacent line, and the right protrusion portion of region E has a length of 20 nm or less not to overlap with an adjacent line.

In addition, in the conventional pattern forming step, when forming the second pattern, a plurality of blocks 17b are provided at predetermined positions in order to cut spaces of a spacer of the pattern forming target film 11 having the first pattern. At this time, in order to prevent a space, which is not an object to be cut, from being cut, it is necessary to determine the length of the blocks 17b of the cut pattern. For example, as illustrated in FIG. 40B, in the case of cutting the portion indicated by region F in the space, it is necessary to determine the cut pattern such that the block 17b of the cut pattern includes region F, the left protrusion portion of region F has a length of 20 nm or less, and the right protrusion portion of region F has a length of 20 nm or less.

On the contrary, in the first pattern forming step of the first exemplary embodiment, a line having a line width of the core material 12 having a line-and-space shape is cut when forming the second pattern. At this time, in order to prevent a line, which is not an object to be cut, from being cut, it is necessary to determine the length of the holes 14b of the cut pattern. For example, as illustrated in FIG. 41A, in the case of cutting the portion indicated by region G in a line, the cut pattern may be formed such that a hole 14h of the cut pattern includes region G, the left protrusion portion of region G has a length of 60 nm or less not to overlap with an adjacent line, and the right protrusion portion of region G has a length of 60 nm or less not to overlap with an adjacent line. That is, according to the semiconductor device manufacturing method according to the first exemplary embodiment, the positional precision, which is required for a cut pattern to be used in the first pattern forming step of the first exemplary embodiment, may be alleviated as compared to the positional precision, which is required for a cut pattern to be used in the conventional pattern forming step.

In addition, in the second pattern forming step of the first exemplary embodiment, inter-line spaces of the spacer 15 having a line-and-space shape is cut when forming the second pattern. At this time, in order to prevent a space, which is not an object to be cut, from being cut, it is necessary to determine the length of the blocks 17b of the cut pattern. For example, as illustrated in FIG. 41B, in the case of cutting the portion indicated by region H in the space, the cut pattern may be formed such that a block 17b of the cut pattern includes region H, the left protrusion portion of region H has a length of 60 nm or less not to overlap with an adjacent line, and the right protrusion portion of region H has a length of 60 nm or less not to overlap with an adjacent line. That is, according to the semiconductor device manufacturing method according to the first exemplary embodiment, the positional precision, which is required for a cut pattern to be used in the second pattern forming step of the first exemplary embodiment, may be alleviated as compared to the positional precision, which is required for a cut pattern to be used in the conventional pattern forming step.

Figure 42A:
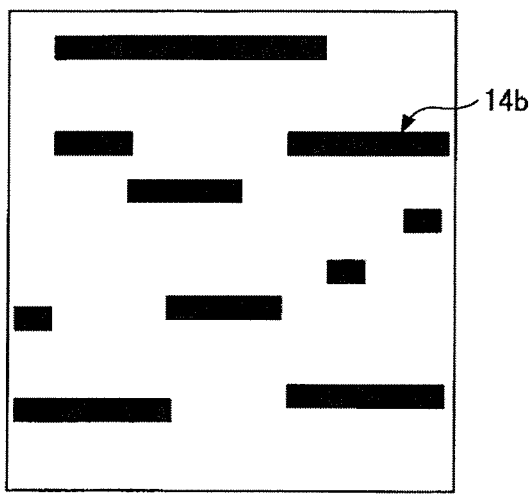
FIGS. 42A and 42B are views exemplifying shapes of conventional cut patterns.
Figure 42B:
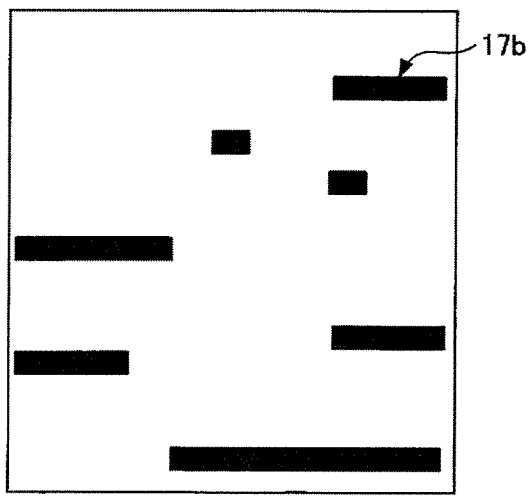

Next, descriptions will be made on a shape of a cut pattern. FIGS. 42A and 42B are views exemplifying shapes of conventional cut patterns, respectively. FIGS. 43A and 43B are views exemplifying shapes of cut patterns according to the first exemplary embodiment of the present disclosure, respectively.

More specifically, FIGS. 42A and 42B are views exemplifying shapes of cut patterns that are used in the conventional first and pattern forming steps, respectively. FIGS. 43A and 43B are views exemplifying shapes of cut patterns that are used in the first and pattern forming steps in the first exemplary embodiment, respectively.

As described above, in the conventional first pattern forming step, a first cut mask (resist pattern), in which the shapes of respective blocks 14b are different from each other as illustrated in FIG. 42A, is used. In addition, in the conventional second pattern forming step, a second cut mask (resist pattern), in which the shapes of respective blocks 17b are different from each other as illustrated in FIG. 42B, is used.

On the contrary, in the first pattern forming step according to the first exemplary embodiment of the present disclosure, a cut mask, in which the shapes of the respective holes 14h are equal to each other, may be used as illustrated in FIG. 43A. In addition, in the second pattern forming step according to the first exemplary embodiment of the present disclosure, a cut mask, in which the shapes of respective blocks 17b are equal to each other as illustrated in FIG. 43B, may be used. Due to this, a mask design is facilitated.

Figure 44A:
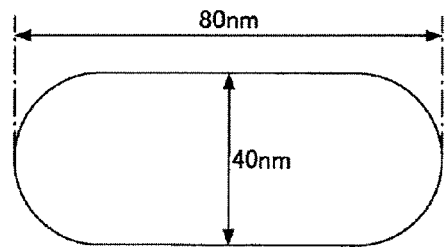
FIGS. 44A and 44B are views (Part 1) for describing a change in shape before and after a block slimming processing.
Figure 44B:
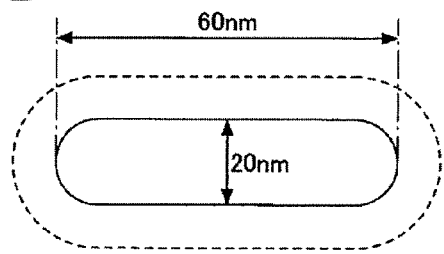
Figure 45A:
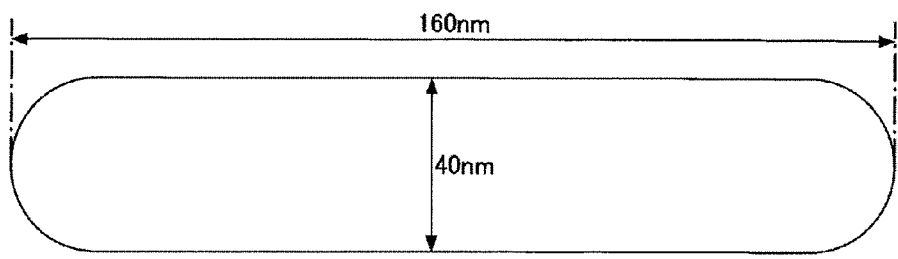
FIGS. 45A and 45B are views (Part 2) for describing a change in shape before and after a block slimming processing.
Figure 45B:
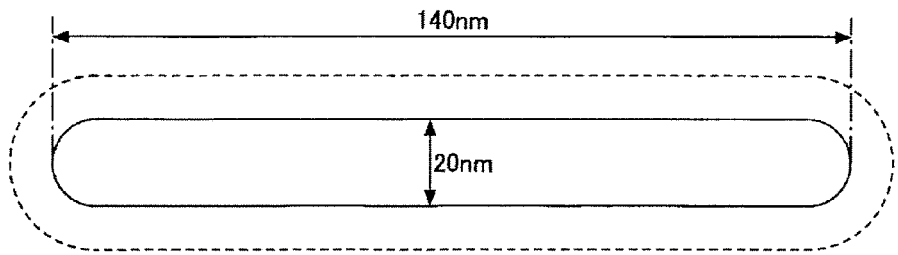

Next, descriptions will be made on a shape change of blocks in a cut pattern before and after a slimming processing. FIGS. 44A and 44B and FIGS. 45A and 45B are views for describing a shape change of blocks in a cut pattern before and after a slimming processing. More specifically, FIGS. 44A and 44B are views illustrating shapes before and after the slimming processing of a block having a width of 40 nm and a length of 80 nm, respectively. In addition, FIGS. 45A and 45B are views illustrating shapes before and after the slimming processing of a block having a width of 40 nm and a length of 160 nm, respectively. In addition, the broken lines in FIGS. 44B and 45B indicate the shapes before the slimming processing, and the solid lines indicate the shapes after the slimming processing.

In the case of performing the slimming processing on the block having a width of 40 nm and a length of 80 nm as illustrated in FIG. 44A, the block becomes equally or substantially equally smaller from the periphery of the block. Due to this, after the slimming processing has been performed for a predetermined length of time, the block becomes, for example, a block having a width of 20 nm and a length of 60 nm as illustrated in FIG. 44B. That is, the block, of which the aspect ratio of the width and the length was 1:2 before the slimming processing, becomes a block, of which the aspect ratio is 1:3, after the slimming processing.

On the contrary, in the case of performing the slimming processing on the block having a width of 40 nm and a length of 160 nm as illustrated in FIG. 45A, the block becomes equally or substantially equally smaller from the periphery of the block. Due to this, after the slimming processing has been performed for a predetermined length of time, the block becomes, for example, a block having a width of 20 nm and a length of 140 nm as illustrated in FIG. 45B. That is, the block, of which the aspect ratio of the width and the length was 1:4 before the slimming processing, becomes a block, of which the aspect ratio is 1:7, after the slimming processing.

That is, in the case where a plurality of blocks having different shapes exist in a cut pattern, i.e. in the case of the conventional cut pattern, a difference occurs between the changes of aspect ratios before and after the slimming processing due to the shapes of the blocks. Due to this, a mask design becomes complicated.

On the contrary, in the case of the cut pattern of the first exemplary embodiment of the present disclosure, such a problem does not occur because the shapes of the plurality of blocks are equal to each other. Due to this, a mask design is facilitated.

In addition, the shape change of blocks in a cut pattern before and after a slimming processing is also applicable to the shape change of holes in a cut pattern before and after a shrinking processing.

As described above, according to the semiconductor device manufacturing method according to the first exemplary embodiment of the present disclosure, the positional precision, which is required for forming a pattern using a 1D layout, may be alleviated.

Second Exemplary Embodiment

Figure 46:
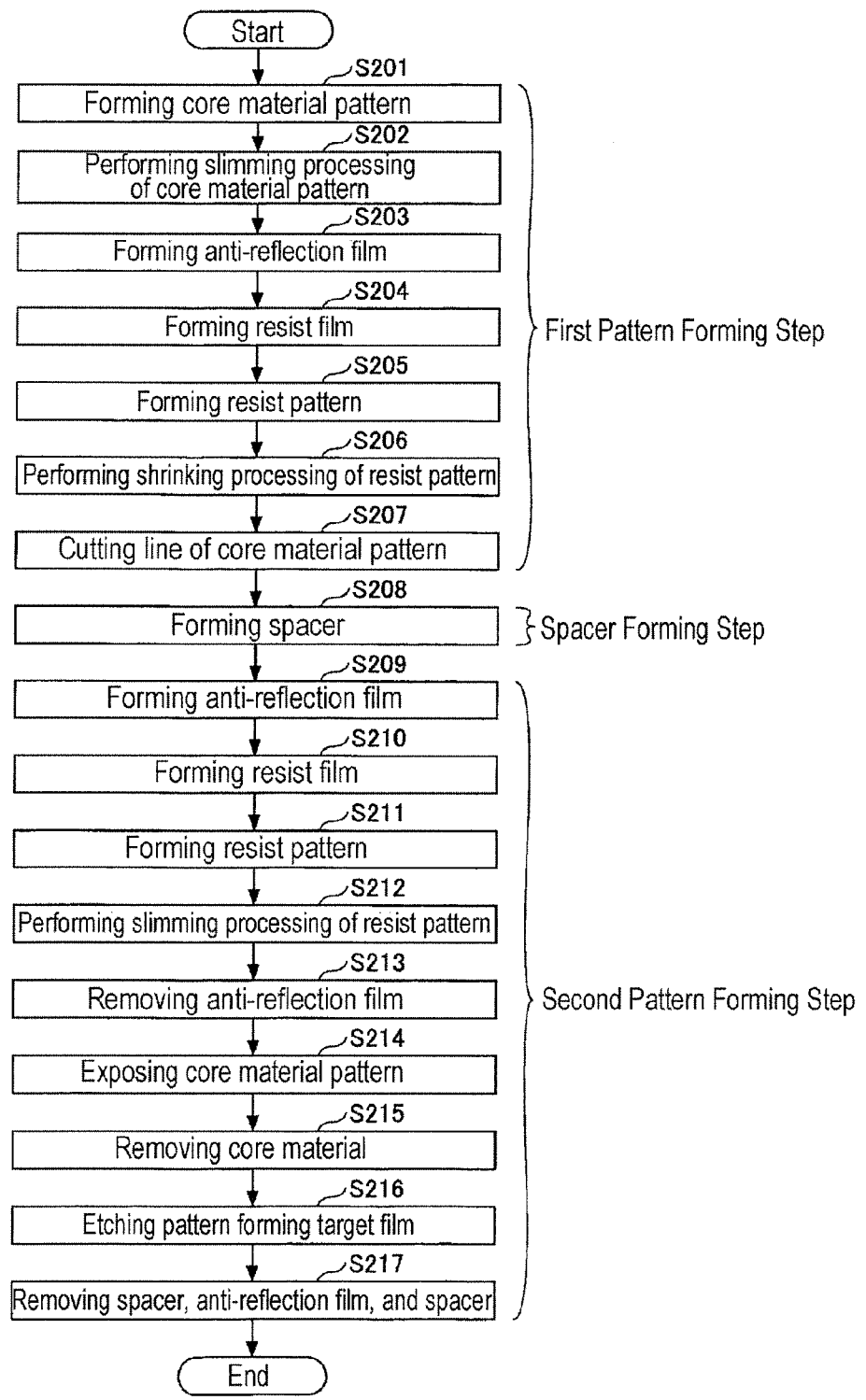
FIG. 46 is a flowchart exemplifying a semiconductor device manufacturing method according to a second exemplary embodiment of the present disclosure.

Descriptions will be made on a semiconductor device manufacturing method according to a second exemplary embodiment. FIG. 46 is a flowchart exemplifying the semiconductor device manufacturing method according to the second exemplary embodiment of the present disclosure.

The semiconductor device manufacturing method according to the second exemplary embodiment of the present disclosure includes a first pattern forming step, a spacer forming step, and a second pattern forming step, as in the first exemplary embodiment. In addition, the semiconductor device manufacturing method according to the second exemplary embodiment performs the first pattern forming step, the spacer forming step, and the second pattern forming step in this order.

The semiconductor device manufacturing method according to the second exemplary embodiment of the present disclosure is different from the semiconductor device manufacturing method according to the second exemplary embodiment in that, in the second pattern forming step, the anti-reflection film is formed without exposing the core material pattern. Hereinafter, descriptions will be made focusing on the features of the second exemplary embodiment which are different from those of the first exemplary embodiment.

The first pattern forming step includes a step of forming a core material pattern (step S201), a step of performing a slimming processing of the core material pattern (step S202), a step of forming an anti-reflection film (step S203), a step of forming a resist film (step S204), a step of forming a resist pattern (step S205), a step of performing a shrinking processing of the resist pattern (step S206), and a step of cutting a line of the core material pattern (step S207). In addition, steps S201, S202, S203, S204, S205, S206, and S207 in the second exemplary embodiment correspond to steps S101, S102, S103, S104, S105, S106, and S107 in the first exemplary embodiment, respectively.

The spacer forming step includes a step of forming a spacer (step S208). In addition, step S208 in the second exemplary embodiment corresponds to step S108 in the first exemplary embodiment.

The second pattern forming step includes a step of forming an anti-reflection film (step S209), a step of forming a resist film (step S210), a step of forming a resist pattern (step S211), a step of performing a slimming processing of the resist pattern (step S212), a step of removing the anti-reflection film (step S213), a step of exposing the core material pattern (step S214), a step of removing the core material pattern (step S215), a step of etching the pattern forming target film (step S216), and a step of removing the spacer, the anti-reflection film, and the resist film (step S217).

Figure 47A:
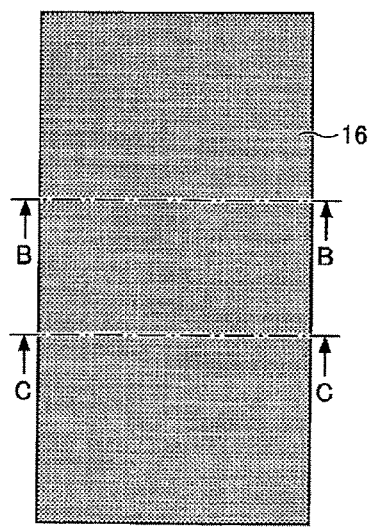
FIGS. 47A to 47C are views (Part 1) for describing each step of the semiconductor device manufacturing method according to the second exemplary embodiment of the present disclosure.
Figure 47B:
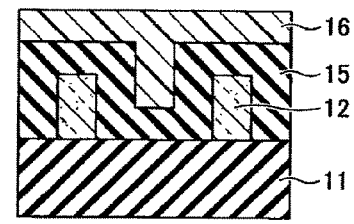
Figure 47C:
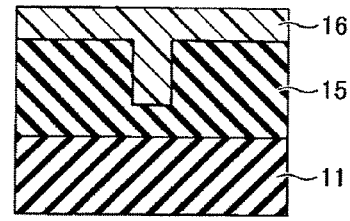
Figure 48A:
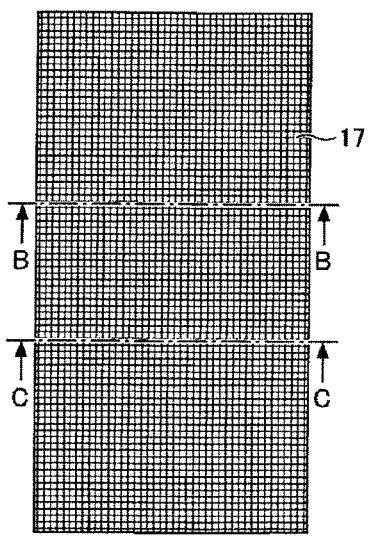
FIGS. 48A to 48C are views (Part 2) for describing each step of the semiconductor device manufacturing method according to the second exemplary embodiment of the present disclosure.
Figure 48B:
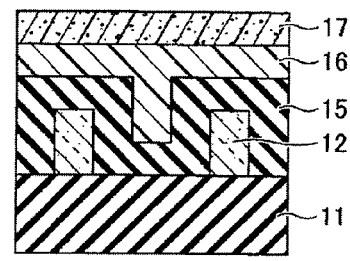
Figure 48C:
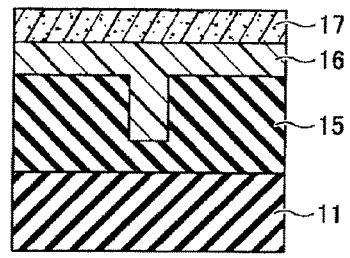
Figure 49A:
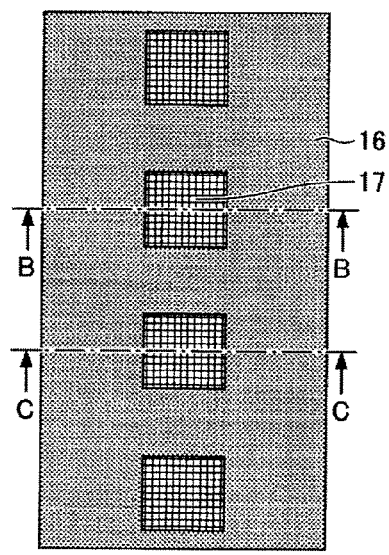
FIGS. 49A to 49C are views (Part 3) for describing each step of the semiconductor device manufacturing method according to the second exemplary embodiment of the present disclosure.

Hereinafter, each step will be described. FIGS. 47A to 47C to FIGS. 55A to 55C are views for describing respective steps of the semiconductor device manufacturing method according to the second exemplary embodiment of the present disclosure. FIGS. 47A, 48A, 49A, . . . , and 55A are plan views illustrating a semiconductor device in respective steps, FIGS. 47B, 48B, 49B, . . . , and 55B are cross-sectional views taken along line B-B in FIGS. 47A, 48A, 49A, . . . , and 55A, respectively, and FIGS. 47C, 48C, 49C, . . . , and 55C are cross-sectional views taken along line C-C in FIGS. 47A, 48A, 49A, . . . , and 55A, respectively.

In addition, the materials used for the following respective steps may be the same as, for example, those in the first exemplary embodiment.

In steps S201 to S207, the first pattern is formed as illustrated in FIGS. 2A and 2B to FIGS. 8A to 8C, as in the first exemplary embodiment.

In step S208, the spacer 15 is formed as illustrated in FIGS. 9A to 9C, as in the first exemplary embodiment.

In step S209, an anti-reflection film is formed. More specifically, as illustrated in FIGS. 47A to 47C, an anti-reflection film 16 is formed on the pattern forming target film 15 by, for example, spin coating.

In step S210, a resist film is formed. More specifically, as illustrated in FIGS. 48A to 48C, a resist film 17 is formed on the anti-reflection film 16.

Figure 49B:
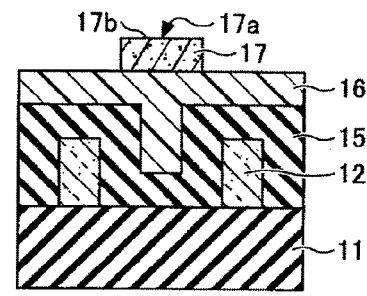
Figure 49C:
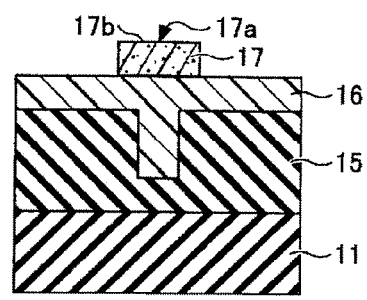

In step S211, a resist pattern is formed. More specifically, as illustrated in FIGS. 49A to 49C, a resist pattern 17a, which has a plurality of blocks 17b at predetermined positions, is formed by exposure and development using ArF having a wavelength of, for example, 193 nm.

Figure 50A:
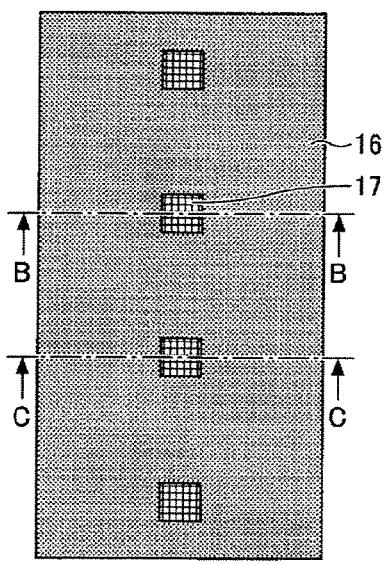
FIGS. 50A to 50C are views (Part 4) for describing each step of the semiconductor device manufacturing method according to the second exemplary embodiment of the present disclosure.
Figure 50B:
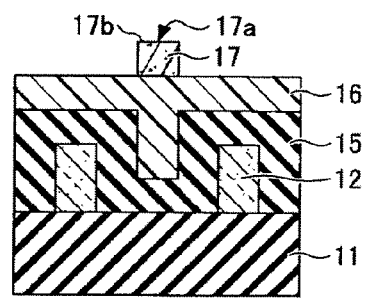
Figure 50C:
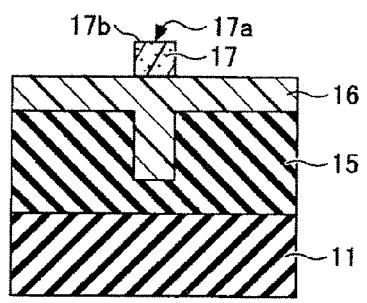

In step S212, a slimming processing of the resist pattern is performed. More specifically, as illustrated in FIGS. 50A to 50C, the blocks 17b of the core material pattern 17a become smaller, for example, by performing a heat treatment.

Figure 51A:
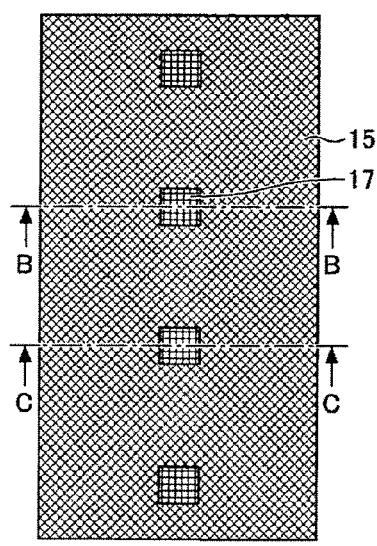
FIGS. 51A to 51C are views (Part 5) for describing each step of the semiconductor device manufacturing method according to the second exemplary embodiment of the present disclosure.
Figure 51B:
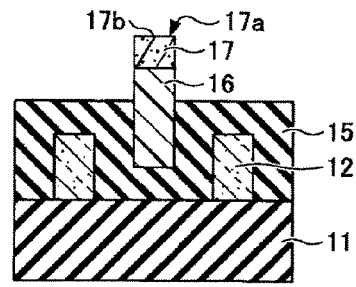
Figure 51C:
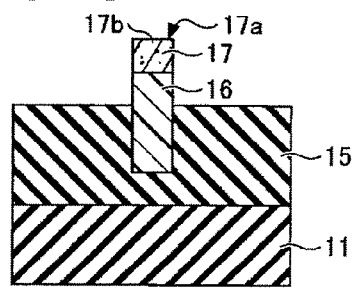

In step S213, the anti-reflection film is removed. More specifically, as illustrated in FIGS. 51A to 51C, the anti-reflection film 16 is removed through anisotropic etching by, for example, RIE, by using the resist pattern 17a as a mask.

Figure 52A:
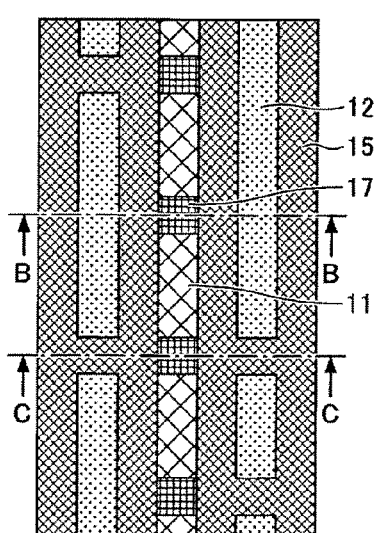
FIGS. 52A to 52C are views (Part 6) for describing each step of the semiconductor device manufacturing method according to the second exemplary embodiment of the present disclosure.
Figure 52B:
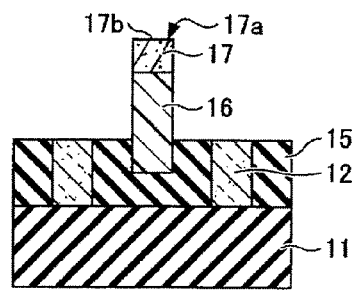
Figure 52C:
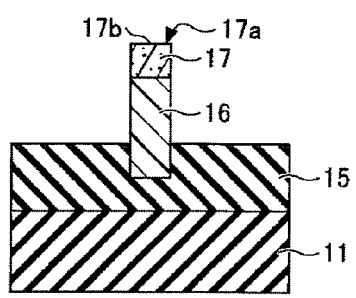

In step S214, the core material is exposed. More specifically, as illustrated in FIGS. 52A to 52C, the spacer 15 is etched until the core material pattern 12a is exposed.

Figure 53A:
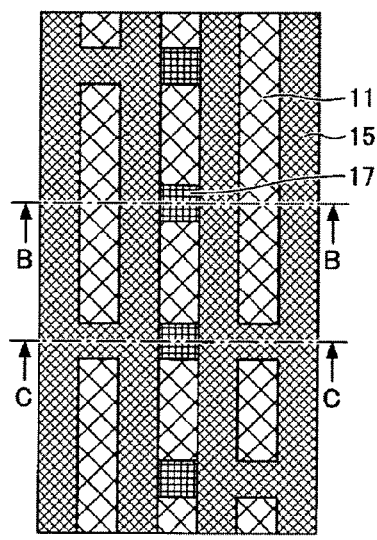
FIGS. 53A to 53C are views (Part 7) for describing each step of the semiconductor device manufacturing method according to the second exemplary embodiment of the present disclosure.
Figure 53B:
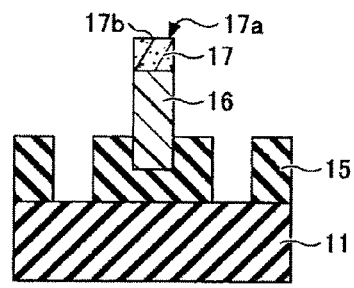
Figure 53C:
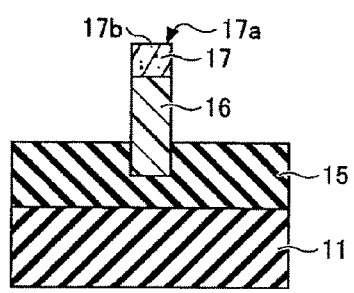

In step S215, the core material is removed. More specifically, as illustrated in FIGS. 53A to 53C, the core material 12 is removed through anisotropic etching by, for example, RIE.

Figure 54A:
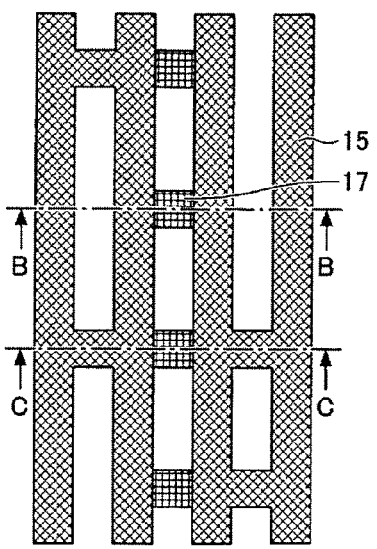
FIGS. 54A to 54C are views (Part 8) for describing each step of the semiconductor device manufacturing method according to the second exemplary embodiment of the present disclosure.
Figure 54B:
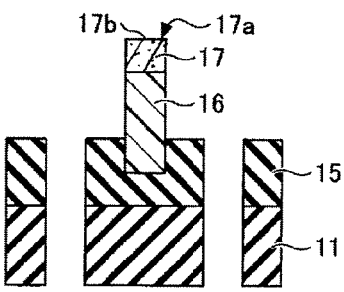
Figure 54C:
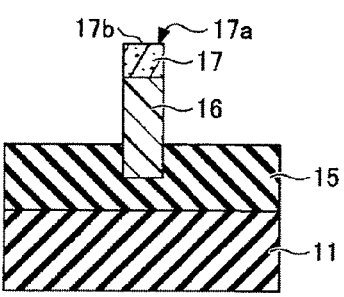

In step S216, the pattern forming target film is etched. More specifically, as illustrated in FIGS. 54A to 54C, the pattern forming target film 11 is etched through anisotropic etching by, for example, RIB, by using the resist film 17 and the spacer 15 as a mask.

Figure 55A:
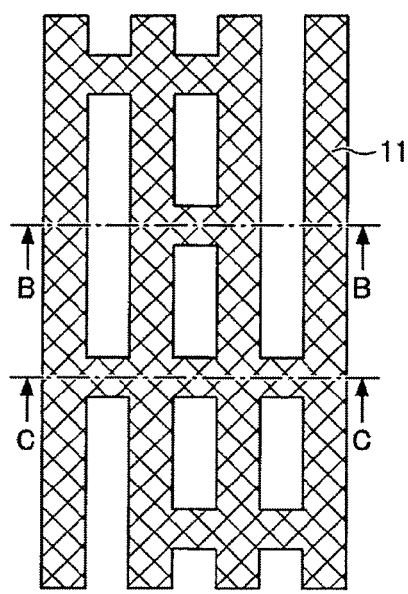
FIGS. 55A to 55C are views (Part 9) for describing each step of the semiconductor device manufacturing method according to the second exemplary embodiment of the present disclosure.
Figure 55B:
Figure 55C:

In step S217, the spacer, the anti-reflection film, and the resist film are removed. More specifically, as illustrated in FIGS. 55A to 55C, the spacer 15, the anti-reflection film 16, and the resist film 17, which remain on the pattern forming target film 11, are removed through anisotropic etching by, for example, RIE.

According to the foregoing steps S209 to S217, a second pattern may be formed.

As described above, according to the semiconductor device manufacturing method according to the second exemplary embodiment of the present disclosure, the positional precision of a cut pattern, which is required for forming a pattern using a 1D layout may be alleviated, as in the first exemplary embodiment.

Third Exemplary Embodiment

Figure 56:
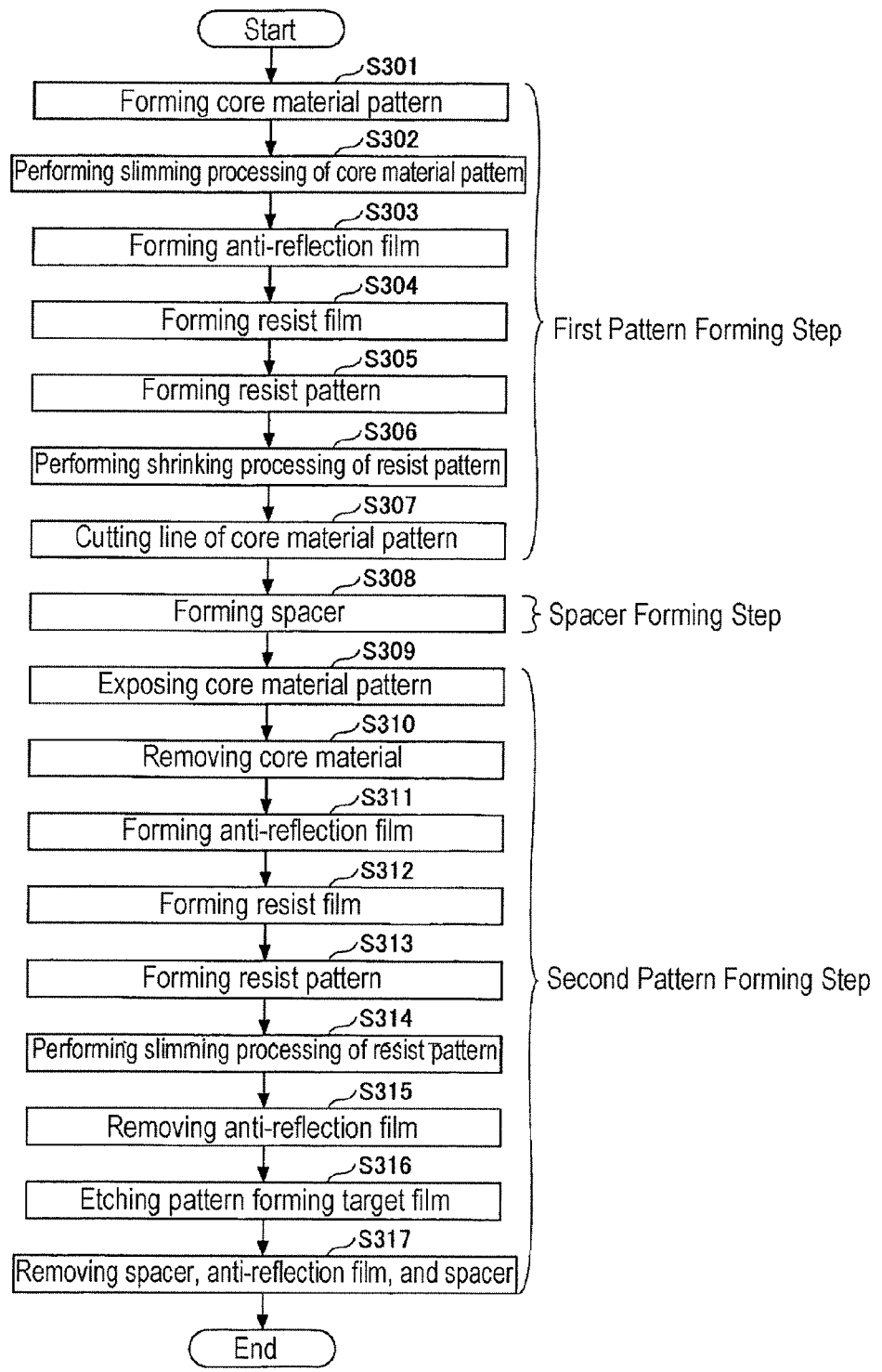
FIG. 56 is a flowchart exemplifying a semiconductor device manufacturing method according to a third exemplary embodiment of the present disclosure.

Descriptions will be made on a semiconductor device manufacturing method according to a third exemplary embodiment. FIG. 56 is a flowchart exemplifying the semiconductor device manufacturing method according to the third exemplary embodiment of the present disclosure.

The semiconductor device manufacturing method according to the third exemplary embodiment of the present disclosure includes a first pattern forming step, a spacer forming step, and a second pattern forming step, as in the first exemplary embodiment. In addition, the semiconductor device manufacturing method according to the third exemplary embodiment performs the first pattern forming step, the spacer forming step, and the second pattern forming step in this order.

The semiconductor device manufacturing method according to the third exemplary embodiment of the present disclosure is different from the semiconductor device manufacturing method according to the second exemplary embodiment in that, in the second pattern forming step, the core material is removed until an anti-reflection film is formed. Hereinafter, descriptions will be made focusing on the features of the third exemplary embodiment which are different from those of the first exemplary embodiment.

The first pattern forming step includes a step of forming a core material pattern (step S301), a step of performing a slimming processing of the core material pattern (step S302), a step of forming an anti-reflection film (step S303), a step of forming a resist film (step S304), a step of forming a resist pattern (step S305), a step of performing a shrinking processing of the resist pattern (step S306), and a step of cutting a line of the core material pattern (step S307). In addition, steps S301, S302, S303, S304, S305, S306, and S307 in the second exemplary embodiment correspond to steps S101, S102, S103, S104, S105, S106, and S107 in the first exemplary embodiment, respectively.

The spacer forming step includes a step of forming a spacer (step S308). In addition, step S308 in the third exemplary embodiment corresponds to step S108 in the first exemplary embodiment.

The second pattern forming step includes a step of exposing the core material pattern (step S309), a step of removing the core material (step S310), a step of forming an anti-reflection film (step S311), a step of forming a resist film (step S312), a step of forming a resist pattern (step S313), a step of performing a slimming processing of the resist pattern (step S314), a step of removing the anti-reflection film (step S315), a step of etching the pattern forming target film (step S316), and a step of removing the spacer, the anti-reflection film, and the resister (step S317).

Figure 57A:
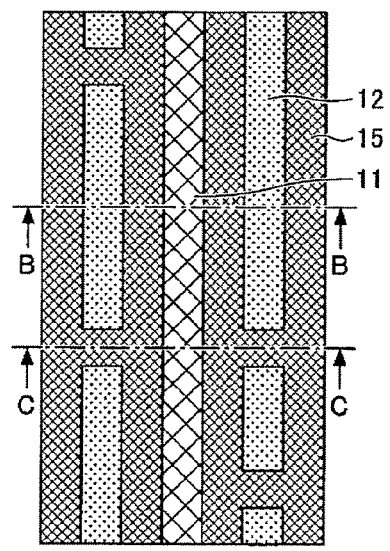
FIGS. 57A to 57C are views (Part 1) for describing each step of the semiconductor device manufacturing method according to the third exemplary embodiment of the present disclosure.
Figure 57B:
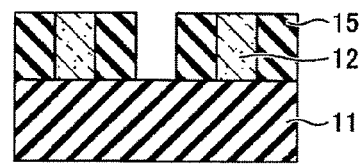
Figure 57C:
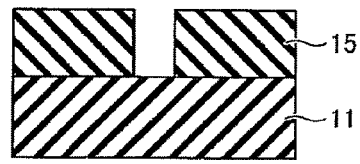
Figure 58A:
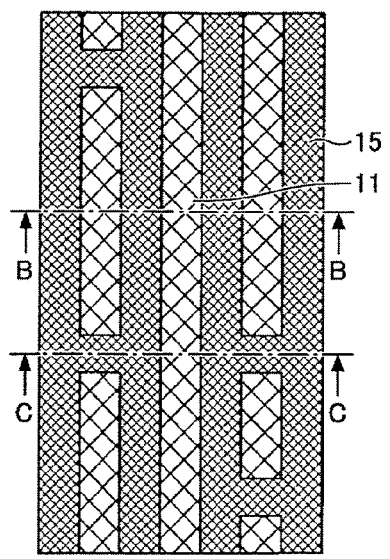
FIGS. 58A to 58C are views (Part 2) for describing each step of the semiconductor device manufacturing method according to the third exemplary embodiment of the present disclosure.
Figure 58B:
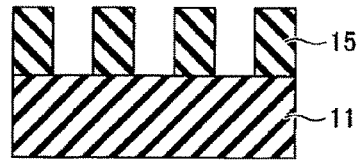
Figure 58C:
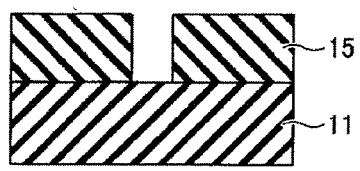
Figure 59A:
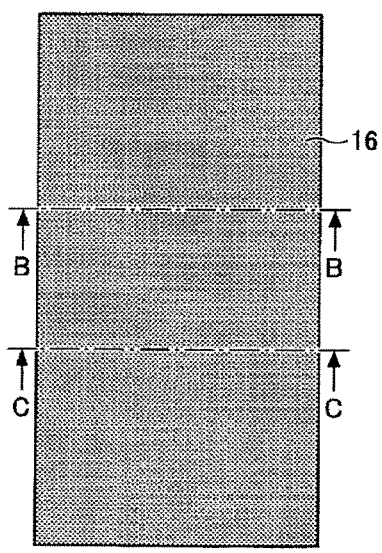
FIGS. 59A to 59C are views (Part 3) for describing each step of the semiconductor device manufacturing method according to the third exemplary embodiment of the present disclosure.

Hereinafter, each step will be described. FIGS. 57A to 57C to FIGS. 65A to 65C are views for describing respective steps of the semiconductor device manufacturing method according to the third exemplary embodiment. FIGS. 57A, 58A, 59A, . . . , and 65A are plan views illustrating a semiconductor device in respective steps, FIGS. 57B, 58B, 59B, . . . , and 65B are cross-sectional views taken along line B-B in FIGS. 57A, 58A, 59A, . . . , and 65A, respectively, and FIGS. 57C, 58C, 59C, . . . , and 65C are cross-sectional views taken along line C-C in FIGS. 57A, 58A, 59A, . . . , and 65A, respectively.

In addition, the materials used for the following respective steps may be the same as, for example, those used in the first exemplary embodiment.

In steps S301 to S307, the first pattern is formed as illustrated in FIGS. 2A and 2B to FIGS. 8A to 8C, as in the first exemplary embodiment.

In step S308, the spacer 15 is formed as illustrated in FIGS. 9A to 9C, as in the first exemplary embodiment.

In step S309, the core material pattern is exposed. More specifically, as illustrated in FIG. 57A to 57C, the spacer 15 is etched through anisotropic etching by, for example, RIE, until the core material pattern 12a is exposed.

In step S310, the core material is removed. More specifically, as illustrated in FIGS. 58A to 58C, the core material 12 is removed through anisotropic etching by, for example, RIE.

Figure 59B:
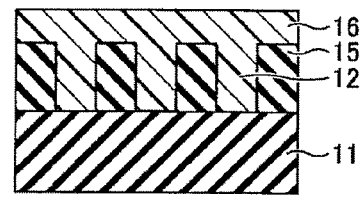
Figure 59C:
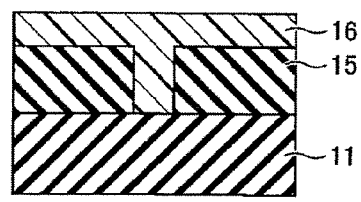

In step S311, an anti-reflection film is formed. More specifically, as illustrated in FIGS. 59A to 59C, an anti-reflection film 16 is formed on the pattern forming target film 11, which is formed with the spacer 15, by, for example, spin coating.

Figure 60A:
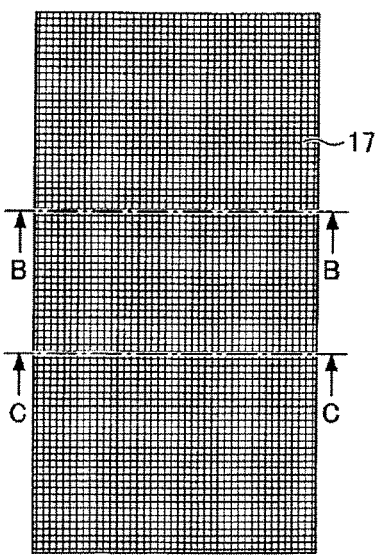
FIGS. 60A to 60C are views (Part 4) for describing each step of the semiconductor device manufacturing method according to the third exemplary embodiment of the present disclosure.
Figure 60B:
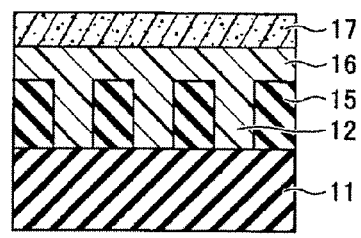
Figure 60C:
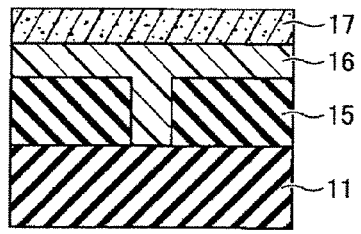

In step S312, a resist film is formed. More specifically, as illustrated in FIGS. 60A to 60C, a resist film 17 is formed on the anti-reflection film 16.

Figure 61A:
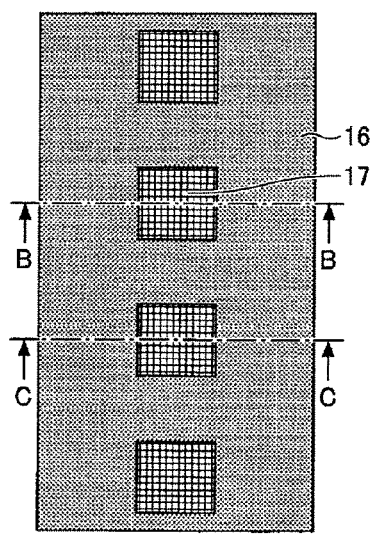
FIGS. 61A to 61C are views (Part 5) for describing each step of the semiconductor device manufacturing method according to the third exemplary embodiment of the present disclosure.
Figure 61B:
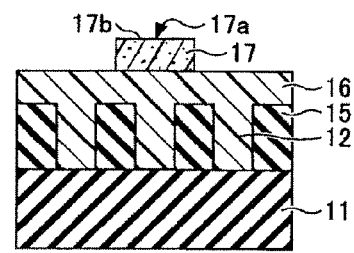
Figure 61C:
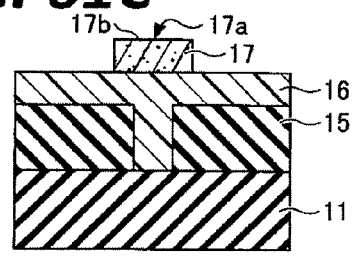

In step S313, a resist pattern is formed. More specifically, as illustrated in FIGS. 61A to 61C, a resist pattern 17a, which has a plurality of blocks 17b at predetermined positions, is formed by exposure and development using ArF having a wavelength of, for example, 193 nm.

Figure 62A:
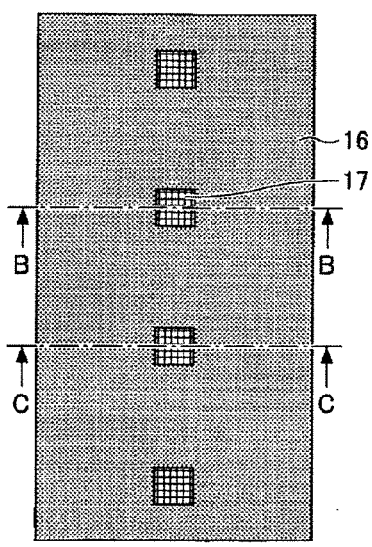
FIGS. 62A to 62C are views (Part 6) for describing each step of the semiconductor device manufacturing method according to the third exemplary embodiment of the present disclosure.
Figure 62B:
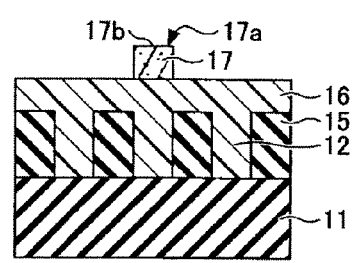
Figure 62C:
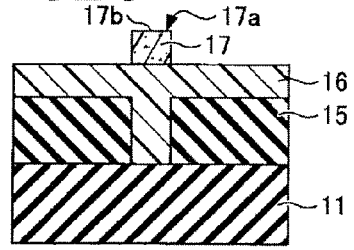

In step S314, a slimming processing of the resist pattern is performed. More specifically, as illustrated in FIGS. 62A to 62C, the blocks 17b of the resist pattern 17a become smaller, for example, by performing a heat treatment.

Figure 63A:
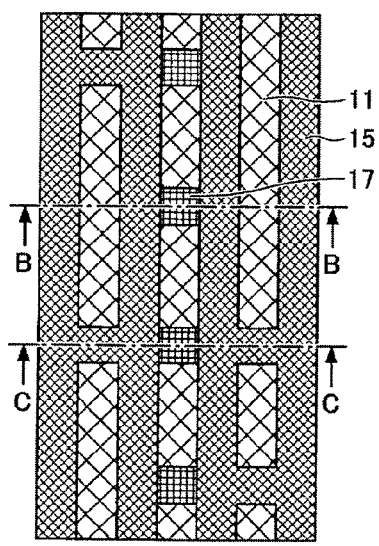
FIGS. 63A to 63C are views (Part 7) for describing each step of the semiconductor device manufacturing method according to the third exemplary embodiment of the present disclosure.
Figure 63B:
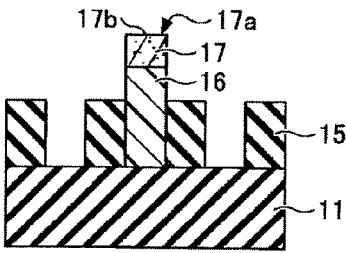
Figure 63C:
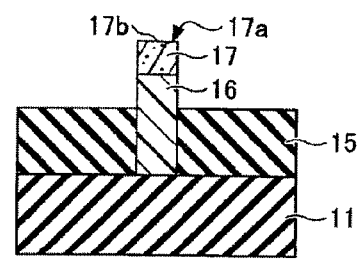

In step S315, the anti-reflection film is removed. More specifically, as illustrated in FIGS. 63A to 63C, the anti-reflection film 16 is removed through anisotropic etching by, for example, RIE, by using the resist pattern 17a as a mask.

Figure 64A:
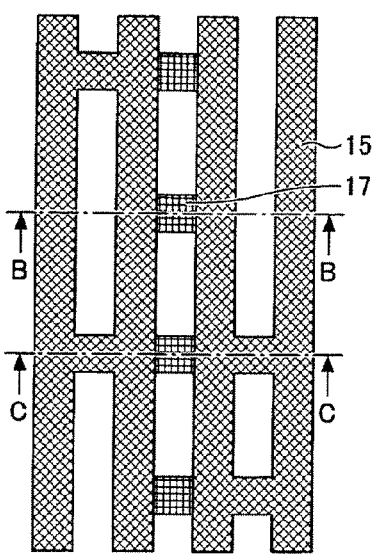
FIGS. 64A to 64C are views (Part 8) for describing each step of the semiconductor device manufacturing method according to the third exemplary embodiment of the present disclosure.
Figure 64B:
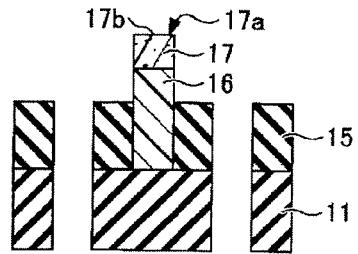
Figure 64C:
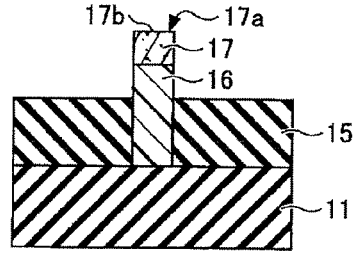

In step S316, the pattern forming target film is etched. More specifically, as illustrated in FIGS. 64A to 64C, the pattern forming target film 11 is etched through anisotropic etching by, for example, RIE, by using the spacer 15 and the resist film 17 as a mask.

Figure 65A:
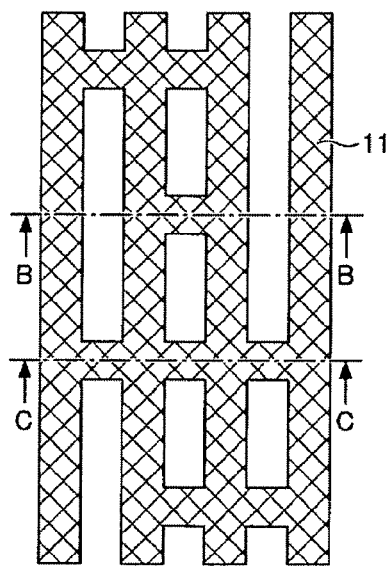
FIGS. 65A to 65C are views (Part 9) for describing each step of the semiconductor device manufacturing method according to the third exemplary embodiment of the present disclosure.
Figure 65B:
Figure 65C:

In step S317, the spacer, the anti-reflection film, and the resist film, are removed. More specifically, as illustrated in FIGS. 65A to 65C, the spacer 15, the anti-reflection film 16, and the resist film 17, which remain on the pattern forming target film 11, are removed through anisotropic etching by, for example, RIE.

According to the foregoing steps S309 to S317, the second pattern may be formed.

As described above, according to the semiconductor device manufacturing method according to the third exemplary embodiment of the present disclosure, the positional precision of a cut pattern, which is required for forming a pattern using a 1D layout, may be alleviated, as in the first exemplary embodiment.

Fourth Exemplary Embodiment

Figure 66:
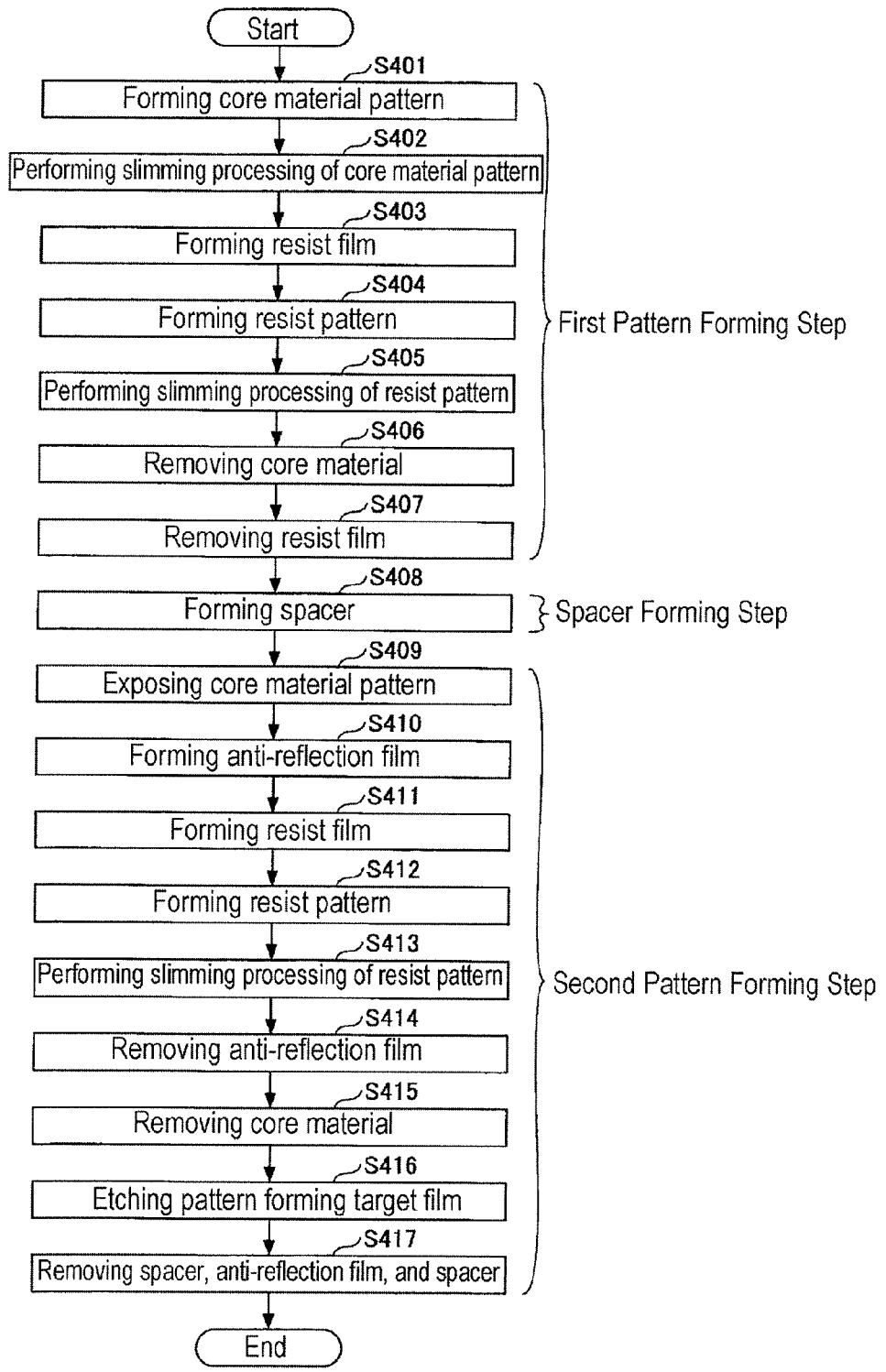
FIG. 66 is a flowchart exemplifying a semiconductor device manufacturing method according to a fourth exemplary embodiment of the present disclosure.

Descriptions will be made on a semiconductor device manufacturing method according to a fourth exemplary embodiment. FIG. 66 is a flowchart exemplifying the semiconductor device manufacturing method according to the fourth exemplary embodiment of the present disclosure.

The semiconductor device manufacturing method according to the fourth exemplary embodiment of the present disclosure includes a first pattern forming step, a spacer forming step, and a second pattern forming step, as in the first exemplary embodiment. In addition, the semiconductor device manufacturing method according to the fourth exemplary embodiment performs the first pattern forming step, the spacer forming step, and the second pattern forming step in this order.

The semiconductor device manufacturing method according to the fourth exemplary embodiment of the present disclosure is different from the semiconductor device manufacturing method according to the first exemplary embodiment in that a core material having a hole is formed in advance in the first pattern forming step. Hereinafter, descriptions will be made focusing on the features of the fourth exemplary embodiment which are different from those of the first exemplary embodiment.

The first pattern forming step includes a step of forming a core material pattern (step S401), a step of performing a slimming processing of the core material pattern (step S402), a step of forming a resist film (step S403), a step of forming a resist pattern (step S404), a step of performing a slimming processing of the resist pattern (step S405), a step of removing the core material (step S406), and a step of removing the resist film (step S407).

The spacer forming step includes a step of forming a spacer (step S408). In addition, step S408 in the fourth exemplary embodiment corresponds to step S108 in the first exemplary embodiment.

The second pattern forming step includes a step of exposing the core material pattern (step S409), a step of forming an anti-reflection film (step S410), a step of forming a resist film (step S411), a step of forming a resist pattern (step S412), a step of performing a slimming processing of the resist pattern (step S413), a step of removing the anti-reflection film (step S414), a step of removing the core material (step S415), a step of etching the pattern forming target film (step S416), and a step of removing the spacer, the anti-reflection film, and the resist film (step S417). In addition, steps S409, S410, S411, S412, S413, S414, S415, S416, and S417 in the fourth exemplary embodiment correspond to steps S109, S110, S111, S112, S113, S114, S115, S116, and S117 in the first exemplary embodiment, respectively.

Figure 67A:
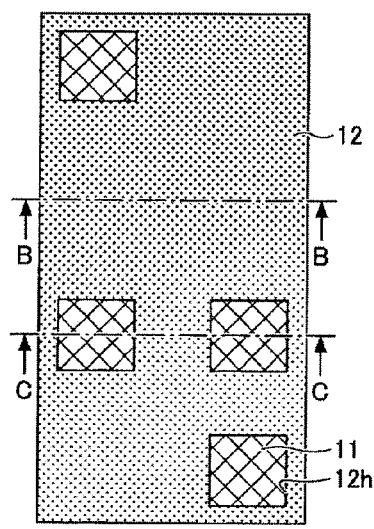
FIGS. 67A to 67C are views (Part 1) for describing each step of the semiconductor device manufacturing method according to the fourth exemplary embodiment of the present disclosure.
Figure 67B:
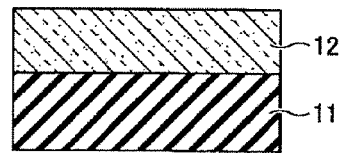
Figure 67C:
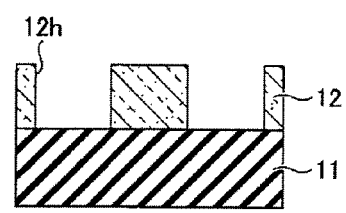
Figure 68A:
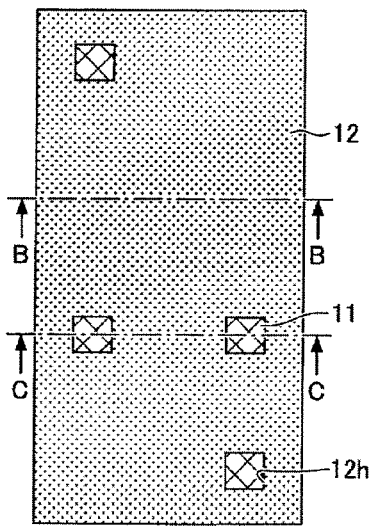
FIGS. 68A to 68C are views (Part 2) for describing each step of the semiconductor device manufacturing method according to the fourth exemplary embodiment of the present disclosure.
Figure 68B:
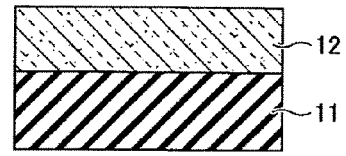
Figure 68C:
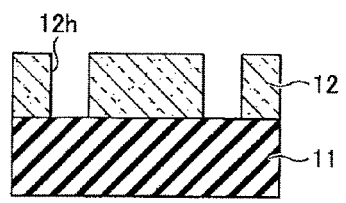
Figure 69A:
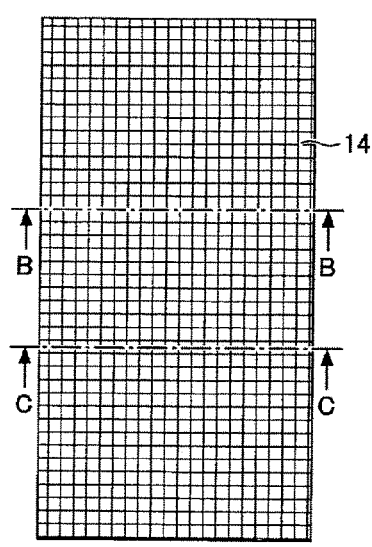
FIGS. 69A to 69C are views (Part 3) for describing each step of the semiconductor device manufacturing method according to the first exemplary embodiment of the present disclosure.

Hereinafter, each step will be described. FIGS. 67A to 67C to FIGS. 73A to 73C are views for describing respective steps of the semiconductor device manufacturing method according to the fourth exemplary embodiment. FIGS. 67A, 68A, 69A, . . . , and 73A are plan views illustrating a semiconductor device in respective steps, FIGS. 67B, 68B, 69B, . . . , and 73B are cross-sectional views taken along line B-B in FIGS. 67A, 68A, 69A, . . . , and 73A, respectively, and FIGS. 67C, 68C, 69C, . . . , and 73C are cross-sectional views taken along line C-C in FIGS. 67A, 68A, 69A, . . . , and 73A, respectively.

In addition, the materials used for the following respective steps may be the same as, for example, those used in the first exemplary embodiment.

In step S401, a core material pattern is formed. More specifically, a core material 12 is formed first on a pattern forming target film 11, for example, through CVD. Thereafter, as illustrated in FIGS. 67A to 67C, a resist pattern 12a, which has openings 12h, is formed by exposure and development using ArF having a wavelength of, for example, 193 nm.

In step S402, a shrinking processing of the core material pattern is performed. More specifically, as illustrated in FIGS. 68A to 68C, the openings 12h of the core material pattern 12a become smaller by forming a SiO$_2$ film by, for example, atomic layer deposition (ALD).

Figure 69B:
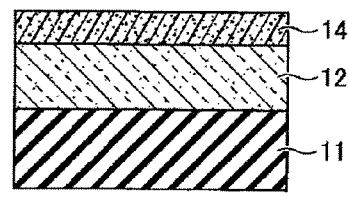
Figure 69C:
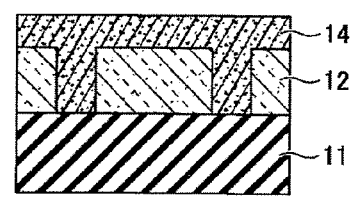

In step S403, a resist film is formed. More specifically, as illustrated in FIGS. 69A to 69C, a resist film 14 is formed on the pattern forming target film 11, which is formed with the core material pattern 12a.

Figure 70A:
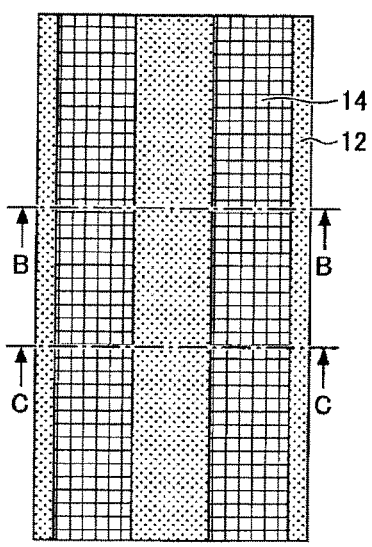
FIGS. 70A to 70C are views (Part 4) for describing each step of the semiconductor device manufacturing method according to the fourth exemplary embodiment of the present disclosure.
Figure 70B:
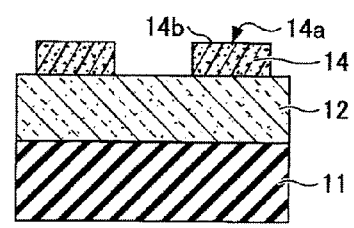
Figure 70C:
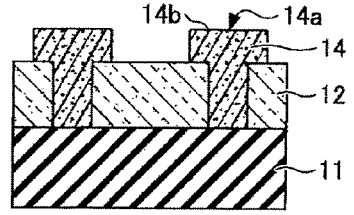

In step S404, a resist pattern is formed. More specifically, as illustrated in FIGS. 70A to 70C, a resist pattern 14a, which is patterned in a line-and-space shape including lines that are aligned with spaces at a predetermined interval being interposed therebetween, by exposure and development using ArF having a wavelength of, for example, 193 nm. The line width/line interval of the line-and-space shape may be set to, for example, 40 nm/40 nm.

Figure 71A:
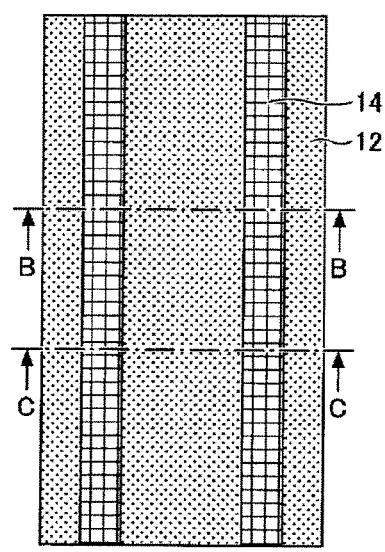
FIGS. 71A to 71C are views (Part 5) for describing each step of the semiconductor device manufacturing method according to the fourth exemplary embodiment of the present disclosure.
Figure 71B:
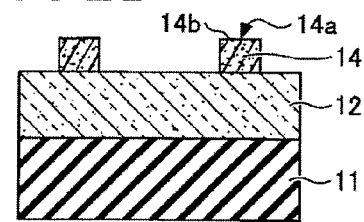
Figure 71C:
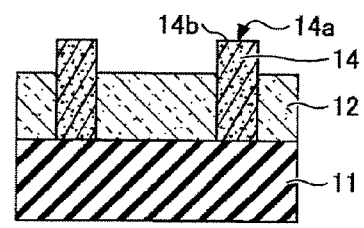

In step S405, a slimming processing of the resist pattern is performed. More specifically, as illustrated in FIGS. 71A to 71C, the line width of the line-and-space shape formed on the resist film 14 is thinned, for example, by performing a heat treatment. The line width/line interval of the line-and-space shape after the slimming processing may be set to, for example, 20 nm/60 nm.

Figure 72A:
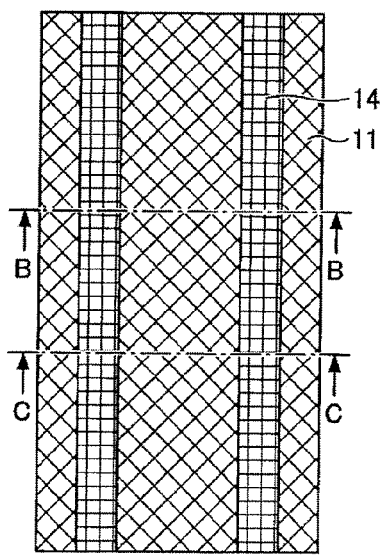
FIGS. 72A to 72C are views (Part 6) for describing each step of the semiconductor device manufacturing method according to the fourth exemplary embodiment of the present disclosure.
Figure 72B:
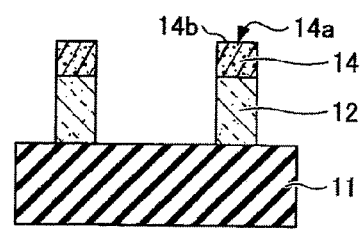
Figure 72C:
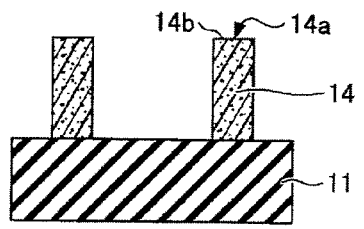

In step S406, the core material is removed. More specifically, as illustrated in FIGS. 72A to 72C, the core material 12 is removed through anisotropic etching by, for example, RIE, by using the resist pattern 14a as a mask.

Figure 73A:
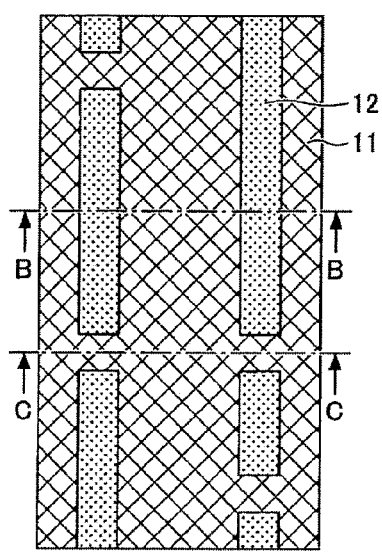
FIGS. 73A to 73C are views (Part 7) for describing each step of the semiconductor device manufacturing method according to the fourth exemplary embodiment of the present disclosure.
Figure 73B:
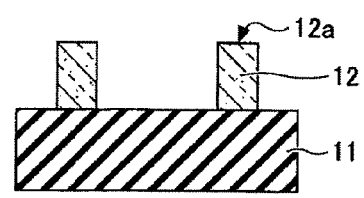
Figure 73C:

In step S407, a resist film is formed. More specifically, as illustrated in FIGS. 73A to 73C, the resist film 14 remaining on the pattern forming target film 11 or the core material 12 is removed.

According to the foregoing steps S401 to S407, the first pattern including lines, which include a separated portion, may be formed.

In step S408, the spacer 15 is formed as illustrated in FIGS. 9A to 9C, as in the first exemplary embodiment.

In steps S409 to S417, the second pattern may be formed as illustrated in FIGS. 10A to 10C to FIGS. 18A to 18C, as in the first exemplary embodiment.

As described above, according to the semiconductor device manufacturing method according to the fourth exemplary embodiment of the present disclosure, the positional precision of a cut pattern, which is required for forming a pattern using a 1D layout, may be alleviated, as in the first exemplary embodiment.

Fifth Exemplary Embodiment

Figure 74:
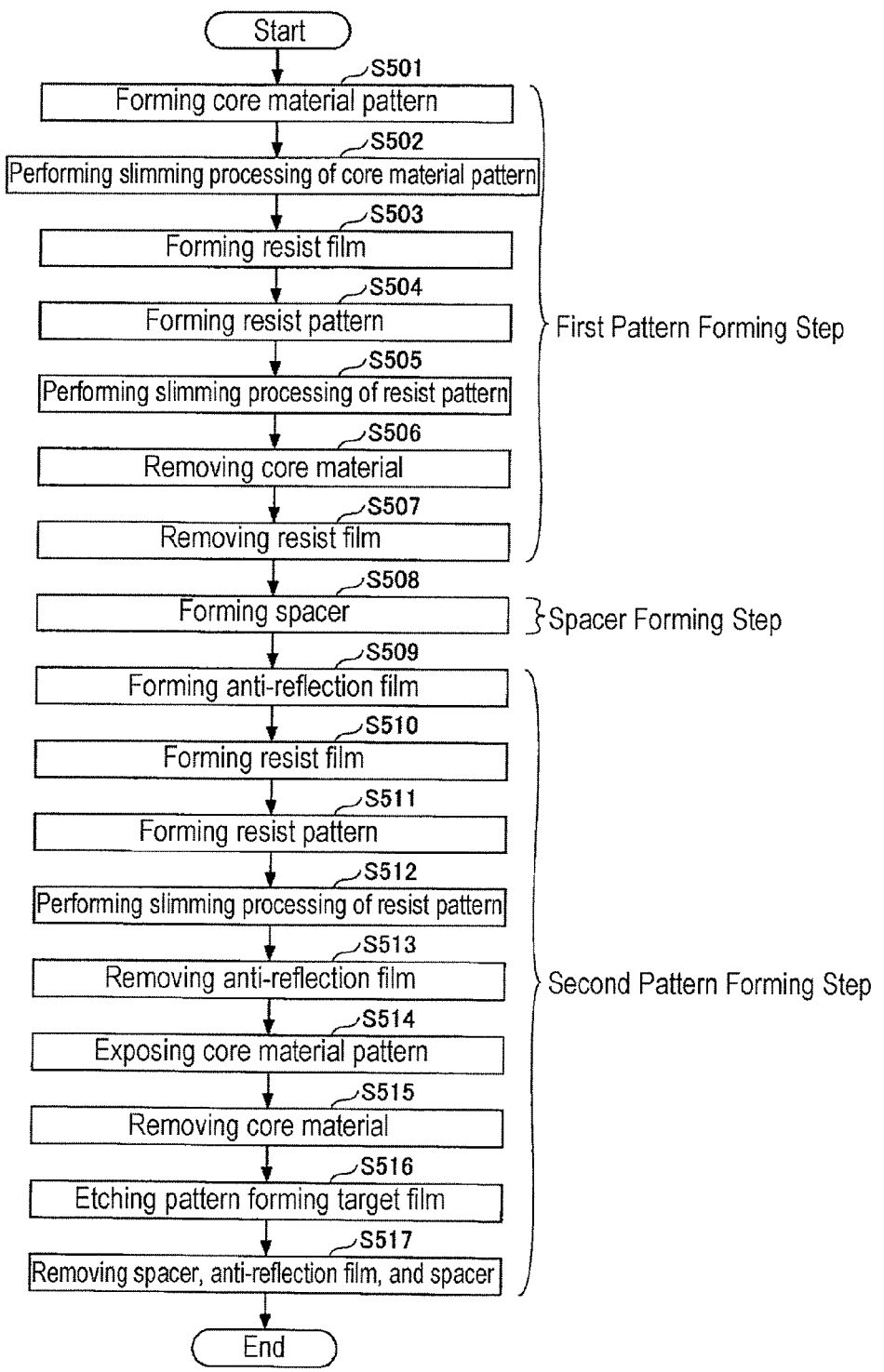
FIG. 74 is a flowchart exemplifying a semiconductor device manufacturing method according to a fifth exemplary embodiment of the present disclosure.

Descriptions will be made on a semiconductor device manufacturing method according to a fifth exemplary embodiment. FIG. 74 is a flowchart exemplifying the semiconductor device manufacturing method according to the fifth exemplary embodiment of the present disclosure.

The semiconductor device manufacturing method according to the fifth exemplary embodiment of the present disclosure includes a first pattern forming step, a spacer forming step, and a second pattern forming step, as in the first exemplary embodiment. In addition, the semiconductor device manufacturing method according to the fourth exemplary embodiment performs the first pattern forming step, the spacer forming step, and the second pattern forming step in this order.

In the semiconductor device manufacturing method according to the fifth embodiment of the present disclosure, the first pattern forming step is the same as the first pattern forming step of the fourth exemplary embodiment, and the second pattern forming step is the same as the second pattern forming step of the second exemplary embodiment.

The first pattern forming step includes a step of forming a core material pattern (step S501), a step of performing a slimming processing on the core material pattern (step S502), a step of forming a resist film (step S503), a step of forming a resist pattern (step S504), a step of performing a slimming processing on the resist pattern (step S505), a step of removing the core material (step S506), and a step of removing the resist film (step S507). In addition, steps S501, S502, S503, S504, S505, S506, and S507 in the fifth exemplary embodiment correspond to steps S401, S402, S403, S404, S405, S406, and S407 in the fourth exemplary embodiment, respectively.

The spacer forming step includes a step of forming a spacer (step S508). In addition, step S508 in the fifth exemplary embodiment corresponds to step S108 in the first exemplary embodiment.

The second pattern forming step includes a step of forming an anti-reflection film (step S509), a step of forming a resist film (step S510), a step of forming a resist pattern (step S511), a step of performing a slimming processing on the resist pattern (step S512), a step of removing the anti-reflection film (step S513), a step of exposing the core material pattern (step S514), a step of removing the core material (step S515), a step of etching the pattern forming target film (step S516), and a step of removing the spacer, the anti-reflection film, and the resist film (step S517). In addition, steps S509, S510, S511, S512, S513, S514, S515, S516, and S517 in the fifth exemplary embodiment correspond to steps S209, S210, S211, S212, S213, S214, S215, S216, and S217 in the second exemplary embodiment, respectively.

As described above, according to the semiconductor device manufacturing method according to the fifth exemplary embodiment of the present disclosure, the positional precision of a cut pattern, which is required for forming a pattern using a 1D layout, may be alleviated, as in the first exemplary embodiment.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method for manufacturing a semiconductor device, the method comprising:
    a first pattern forming step of forming, on a pattern forming target film, a first film that is patterned to have a first pattern that includes lines which are aligned with each other with spaces of a predetermined interval being interposed therebetween and include a separated portion by using a first cut mask;
    a step of forming a spacer to cover a side wall of the first film; and
    a second pattern forming step of forming a pattern forming target film that is patterned to have a second pattern by separating a portion of the spaces of the first pattern using a second cut mask,
    wherein each of the first cut mask and the second cut mask includes a plurality of openings that have equal planar shapes, respectively, or a plurality of light shielding portions that have equal planar shapes, respectively, and
    wherein the step of forming the spacer comprises forming the spacer to cover the side wall but not to cover a top of the first film.

2. The method of claim 1, wherein the first cut mask includes a plurality of openings that have equal planar shapes, respectively, and
    the second cut mask includes a plurality of light shielding portions that have equal planar shapes, respectively.

3. The method of claim 1, wherein the first pattern forming step includes:
    forming a resist pattern; and
    forming the first cut mask by performing a shrinking processing or a slimming processing of the resist pattern so that the openings or the light shielding portions become smaller, and
    the second pattern forming step includes:
    forming a resist pattern; and
    forming the second cut mask by performing a shrinking processing or a slimming processing of the resist pattern so that the openings or the light shielding portions become smaller.

4. The method of claim 1, wherein the step of forming the spacer comprises forming the spacer on an entire surface of the first film and then removing the spacer that covers a top of the first film.

5. The method of claim 1, wherein the step of forming the space is performed subsequent to the first pattern forming step, and the second pattern forming step is performed subsequent to the step of forming the spacer.

6. The method of claim 1, wherein the plurality of openings of each of the first cut mask and the second cut mask are rectangular-shaped with a same length and width, or the plurality of light shielding portions of each of the first cut mask and the second cut mask are rectangular-shaped with a same length and width, respectively.

* * * * *